(12) United States Patent
Kamata et al.

(10) Patent No.: US 9,781,783 B2
(45) Date of Patent: Oct. 3, 2017

(54) LIGHT-EMITTING DEVICE, DISPLAY DEVICE, LIGHT-EMITTING SYSTEM, AND DISPLAY SYSTEM

(75) Inventors: Koichiro Kamata, Kanagawa (JP); Yutaka Shionoiri, Kanagawa (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 24 days.

(21) Appl. No.: 13/442,073

(22) Filed: Apr. 9, 2012

(65) Prior Publication Data
US 2012/0262432 A1 Oct. 18, 2012

(30) Foreign Application Priority Data

Apr. 15, 2011 (JP) ................. 2011-091087

(51) Int. Cl.
G06F 3/038 (2013.01)
H05B 33/08 (2006.01)
H01L 27/32 (2006.01)

(52) U.S. Cl.
CPC ..... H05B 33/0815 (2013.01); H05B 33/0896 (2013.01); *H01L 27/3244* (2013.01); *H01L 2251/5361* (2013.01)

(58) Field of Classification Search
CPC ............. H01L 21/3205; H01L 29/04; H01L 2251/5361; H01L 27/3244; H05B 33/0815; H05B 33/0896
(Continued)

(56) References Cited

U.S. PATENT DOCUMENTS 4,575,621 A   3/1986 Dreifus
4,695,859 A   9/1987 Guha et al.
(Continued)

FOREIGN PATENT DOCUMENTS

EP   2204674 A   7/2010
EP   2270069 A   1/2011
(Continued)

OTHER PUBLICATIONS

Information offer form in Japan Patent Office (Application No. 2012-090238) dated Jan. 11, 2013.
(Continued)

*Primary Examiner* — Nelson Rosario
(74) *Attorney, Agent, or Firm* — Robinson Intellectual Property Law Office; Eric J. Robinson

(57) ABSTRACT

A highly reliable light-emitting device is provided. A lighting device or a display device with a high level of safety and without an exposed electrode is provided. A lighting device or a display device with high layout flexibility is provided. A light-emitting system or a display system to which the light-emitting device or the display device can be applied is provided. An electrode for receiving power and a rectifier circuit are provided in a light-emitting device including an organic EL element and arranged so as to face an electrode for transmitting power, whereby alternating-current power is supplied to the light-emitting device. The alternating-current power is rectified by the rectifier circuit to direct-current power so that the organic EL element in the light-emitting device is driven.

28 Claims, 11 Drawing Sheets

(58) Field of Classification Search
USPC .......... 345/204; 235/379, 492; 257/59, 679; 438/623; 455/566
See application file for complete search history.

(56) References Cited

U.S. PATENT DOCUMENTS

| | | | |
|---|---|---|---|
| 4,829,166 A * | 5/1989 | Froelich .................. | 235/379 |
| 5,789,733 A | 8/1998 | Jachimowicz et al. | |
| 5,881,024 A | 3/1999 | Nishimura et al. | |
| 5,990,496 A | 11/1999 | Kunisato et al. | |
| 6,040,520 A | 3/2000 | Morooka et al. | |
| 6,162,656 A | 12/2000 | Kunisato et al. | |
| 6,590,633 B1 | 7/2003 | Nishi et al. | |
| 6,692,984 B2 | 2/2004 | Yonezawa et al. | |
| 6,838,773 B2 | 1/2005 | Kikuchi et al. | |
| 6,873,099 B2 | 3/2005 | Maeda | |
| 7,029,950 B2 | 4/2006 | Yonehara et al. | |
| 7,128,632 B2 | 10/2006 | Nakamura | |
| 7,156,313 B2 * | 1/2007 | Ou et al. ................. | 235/492 |
| 7,181,179 B2 | 2/2007 | Fujisawa et al. | |
| 7,218,349 B2 | 5/2007 | Kimura | |
| 7,301,511 B2 | 11/2007 | Maeda | |
| 7,333,072 B2 * | 2/2008 | Yamazaki et al. ........ | 345/5 |
| 7,652,359 B2 | 1/2010 | Takayama et al. | |
| 7,928,353 B2 | 4/2011 | Fujimoto et al. | |
| 8,030,745 B2 * | 10/2011 | Yamazaki ................ | 257/679 |
| 8,120,257 B2 | 2/2012 | Takamura | |
| 8,476,632 B2 * | 7/2013 | Tokunaga ................ | 257/59 |
| 8,525,407 B2 | 9/2013 | Matsukura | |
| 2002/0100941 A1 | 8/2002 | Yonehara et al. | |
| 2002/0149119 A1 | 10/2002 | Kumatani | |
| 2002/0167500 A1 * | 11/2002 | Gelbman ................ | G06F 3/14 345/204 |
| 2003/0032213 A1 | 2/2003 | Yonezawa et al. | |
| 2003/0052324 A1 | 3/2003 | Kimura | |
| 2003/0116790 A1 | 6/2003 | Kikuchi et al. | |
| 2004/0152392 A1 | 8/2004 | Nakamura | |
| 2005/0045729 A1 * | 3/2005 | Yamazaki ................ | 235/492 |
| 2005/0202595 A1 | 9/2005 | Yonehara et al. | |
| 2007/0176622 A1 * | 8/2007 | Yamazaki .......... | G06K 19/0728 257/679 |
| 2008/0308641 A1 * | 12/2008 | Finn ................... | G06K 19/0723 235/492 |
| 2009/0159677 A1 | 6/2009 | Yakimov et al. | |
| 2009/0184950 A1 | 7/2009 | Furuta et al. | |
| 2009/0206675 A1 | 8/2009 | Camurati et al. | |
| 2010/0055896 A1 * | 3/2010 | Abe et al. ................ | 438/623 |
| 2010/0173583 A1 | 7/2010 | Iwasaki | |
| 2010/0195231 A1 | 8/2010 | Suzuki et al. | |
| 2010/0222110 A1 * | 9/2010 | Kim ..................... | G06F 1/1616 455/566 |
| 2011/0042661 A1 | 2/2011 | Endo et al. | |
| 2011/0090186 A1 * | 4/2011 | Yamazaki et al. ........ | 345/204 |
| 2011/0108814 A1 | 5/2011 | Iida et al. | |
| 2012/0007096 A1 | 1/2012 | Yamazaki | |
| 2013/0020562 A1 | 1/2013 | Iida et al. | |

FOREIGN PATENT DOCUMENTS

| | | |
|---|---|---|
| EP | 2272894 A | 1/2011 |
| JP | 08-327752 A | 12/1996 |
| JP | 09-113656 A | 5/1997 |
| JP | 09-166673 A | 6/1997 |
| JP | 10-213459 A | 8/1998 |
| JP | 10-300527 A | 11/1998 |
| JP | 11-174164 A | 7/1999 |
| JP | 2000-009821 A | 1/2000 |
| JP | 2000-029410 A | 1/2000 |
| JP | 2000-137453 A | 5/2000 |
| JP | 2000-262369 A | 9/2000 |
| JP | 2002-074306 A | 3/2002 |
| JP | 2002-148361 A | 5/2002 |
| JP | 2002-329418 A | 11/2002 |
| JP | 2002-359068 A | 12/2002 |
| JP | 2002-359069 A | 12/2002 |
| JP | 2003-059651 A | 2/2003 |
| JP | 2003-217868 A | 7/2003 |
| JP | 2004-095541 A | 3/2004 |
| JP | 2004-127923 A | 4/2004 |
| JP | 2004-234868 A | 8/2004 |
| JP | 2005-093190 A | 4/2005 |
| JP | 2006-054197 A | 2/2006 |
| JP | 2007-115629 A | 5/2007 |
| JP | 2007-137234 A | 6/2007 |
| JP | 2007-172918 A | 7/2007 |
| JP | 2007-172919 A | 7/2007 |
| JP | 2007-173088 A | 7/2007 |
| JP | 2007-173424 A | 7/2007 |
| JP | 2007-173519 A | 7/2007 |
| JP | 2007-173520 A | 7/2007 |
| JP | 2007-173525 A | 7/2007 |
| JP | 2007-173564 A | 7/2007 |
| JP | 2007-227523 A | 9/2007 |
| JP | 2007-294137 A | 11/2007 |
| JP | 2007-294519 A | 11/2007 |
| JP | 2008-117742 A | 5/2008 |
| JP | 2008-279227 A | 11/2008 |
| JP | 2008-310631 A | 12/2008 |
| JP | 2009-038019 A | 2/2009 |
| JP | 2009-048814 A | 3/2009 |
| JP | 2009-098650 A | 5/2009 |
| JP | 2009-105033 A | 5/2009 |
| JP | 2009-129766 A | 6/2009 |
| JP | 2009-130132 | 6/2009 |
| JP | 2009-141339 A | 6/2009 |
| JP | 2009-158103 A | 7/2009 |
| JP | 2009-164022 A | 7/2009 |
| JP | 2009-169327 A | 7/2009 |
| JP | 2009-212510 A | 9/2009 |
| JP | 2009-227663 A | 10/2009 |
| JP | 2009-230960 A | 10/2009 |
| JP | 2009-231278 A | 10/2009 |
| JP | 2009-263665 A | 11/2009 |
| JP | 2009-266814 A | 11/2009 |
| JP | 2009-272280 A | 11/2009 |
| JP | 2009-278076 A | 11/2009 |
| JP | 2009-278077 A | 11/2009 |
| JP | 2009-287000 A | 12/2009 |
| JP | 2009-289742 A | 12/2009 |
| JP | 2009-291013 A | 12/2009 |
| JP | 2009-295486 A | 12/2009 |
| JP | 2009-295487 A | 12/2009 |
| JP | 2009-295974 A | 12/2009 |
| JP | 2011-029164 A | 2/2011 |
| JP | 2011-509645 | 3/2011 |
| WO | WO-01/92970 | 12/2001 |
| WO | WO-2009/082566 | 7/2009 |

OTHER PUBLICATIONS

Notification in Japan Patent Office (Application No. 2012-090238) dated Feb. 5, 2013.

* cited by examiner

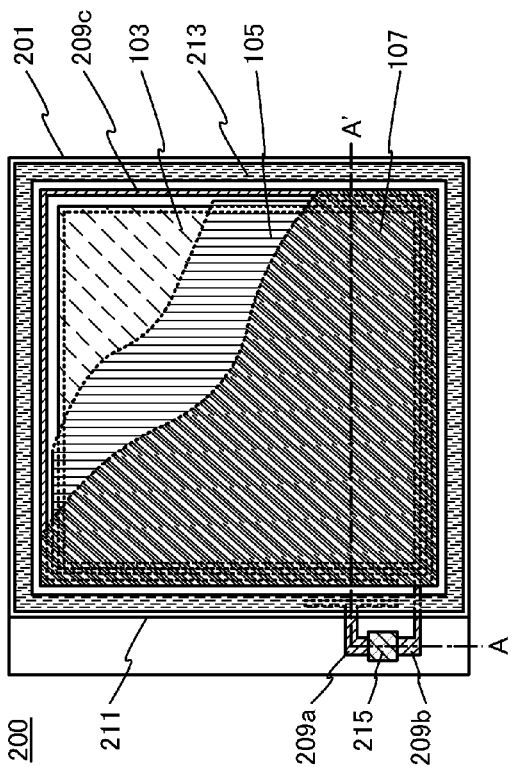
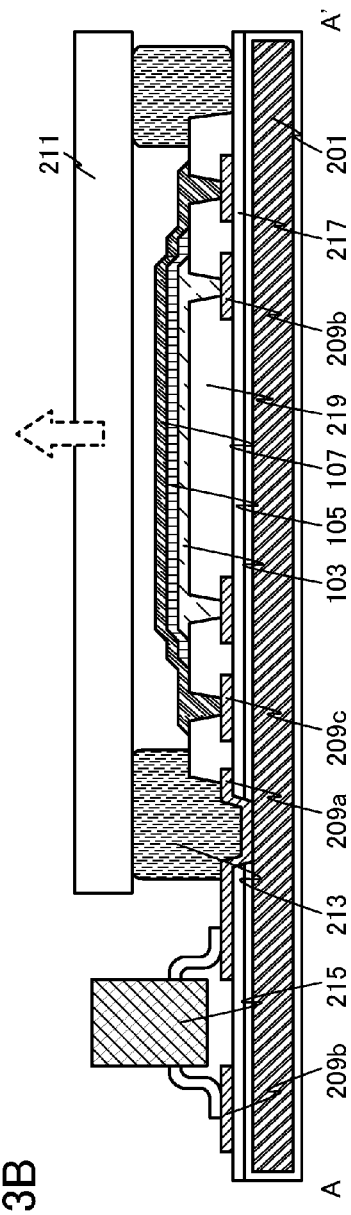
FIG. 3A
FIG. 3B

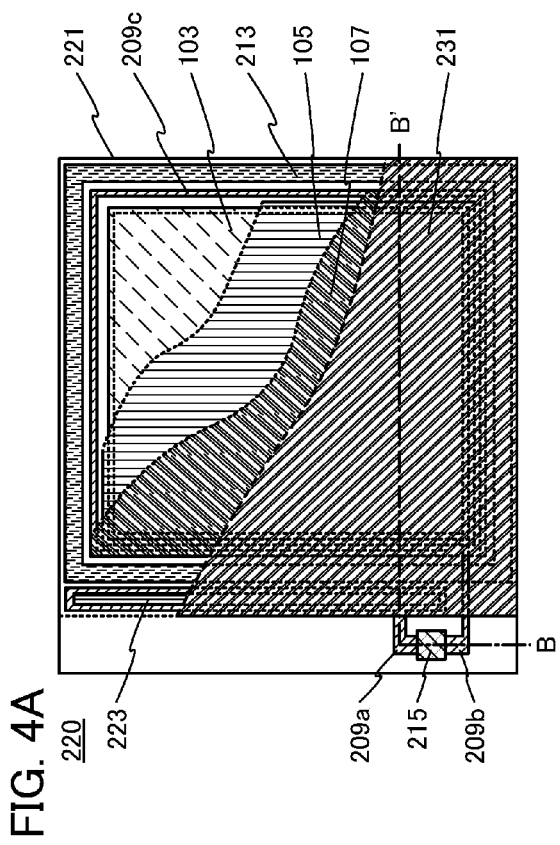
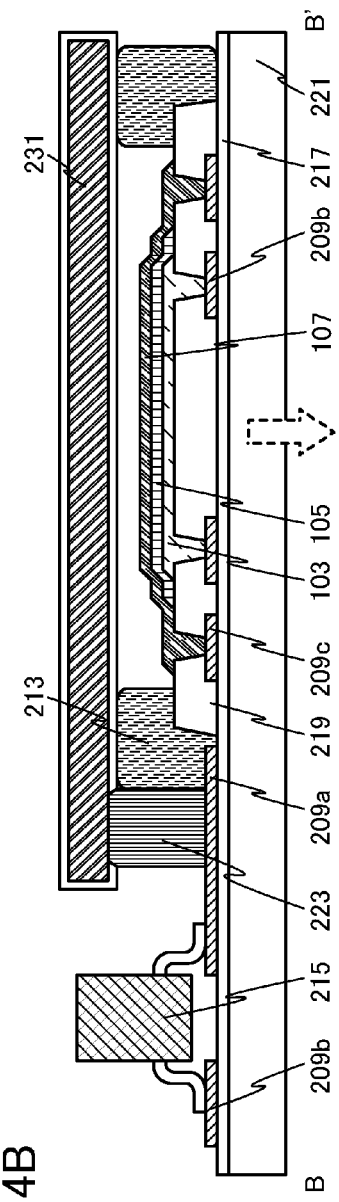
FIG. 4A
FIG. 4B

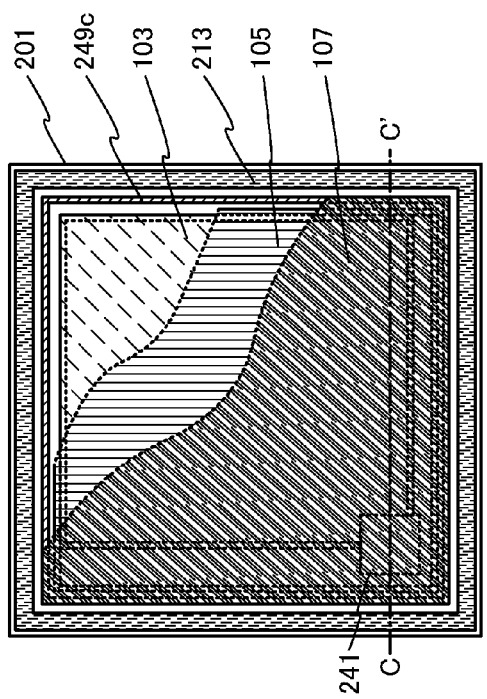
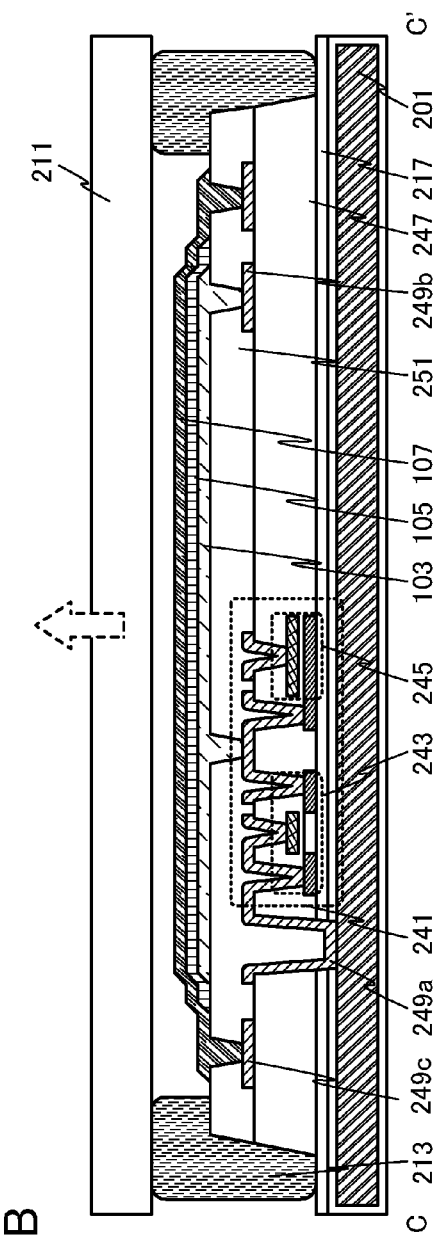
FIG. 5A
FIG. 5B

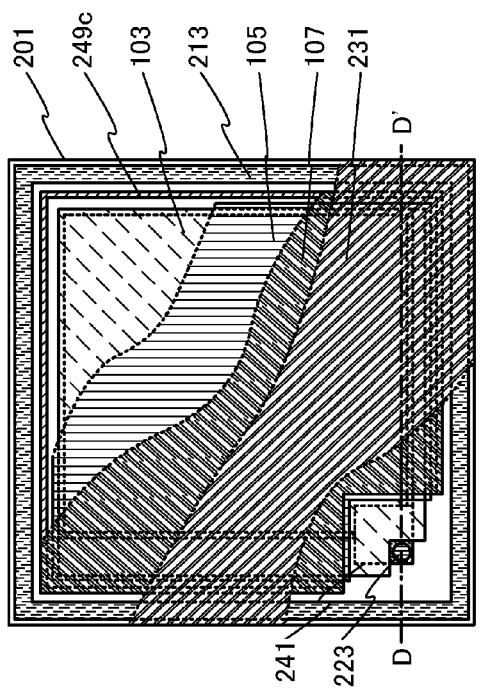
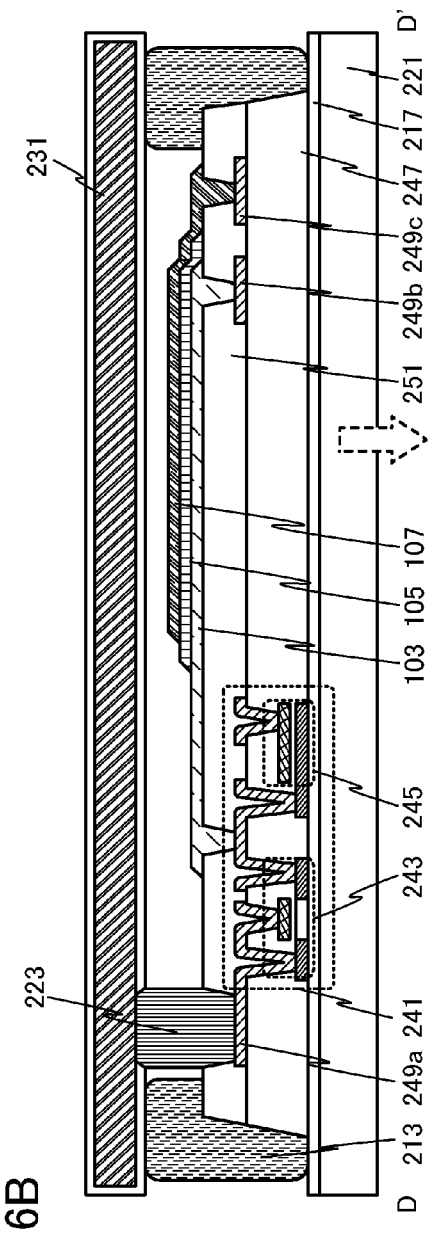
FIG. 6A
FIG. 6B

LIGHT-EMITTING DEVICE, DISPLAY DEVICE, LIGHT-EMITTING SYSTEM, AND DISPLAY SYSTEM

BACKGROUND OF THE INVENTION

1. Field of the Invention

The present invention relates to a light-emitting device including an organic EL element. The present invention also relates to a display device including an organic EL element. The present invention also relates to a light-emitting system including the light-emitting device. The present invention also relates to a display system including the display device.

2. Description of the Related Art

An organic EL element has been actively researched and developed. In the fundamental structure of the organic EL element, a layer containing a light-emitting organic compound is provided between a pair of electrodes. By voltage application to this element, light emission from the light-emitting organic compound can be obtained.

The organic EL element can be formed into a film shape; thus, a large-area element can easily be formed. Accordingly, the organic EL element has a high utility value as a surface light source that can be applied to lighting or the like.

For example, a lighting equipment including an organic EL element is disclosed in Patent Document 1.

Further, a display device in which an organic EL element and a thin film transistor are combined has been actively developed. A display device including an organic EL element does not need a backlight which is necessary for a liquid crystal display device, so that a reduction in thickness and an increase in luminance and contrast can be achieved.

REFERENCE

Patent Document

[Patent Document 1] Japanese Published Patent Application No. 2009-130132

SUMMARY OF THE INVENTION

A connection portion with an exposed electrode, such as a connector or a socket is necessarily connected to a power supply portion mechanically so that power from a power source is supplied to a light-emitting device such as a lighting device including an organic EL element. This might result in electric shock when the exposed electrode is touched. In addition, when water or the like is adhered to the exposed electrode, electric leakage might occur.

Further, when the light-emitting device is provide on a wall, a ceiling, or the like, the light-emitting device needs to be connected to a connection portion provided for the wall, the ceiling, or the like in advance, which limits layout flexibility.

Similarly, at least a wiring with an exposed electrode for supplying power is necessarily provided in a display device including an organic EL element; thus, troubles such as a short circuit, and disconnection due to mechanical stress on the wiring, and electric shock and electric leakage might occur. In addition, when the display device is attached to a wall or the like, the display device cannot be laid out freely because the wiring is drawn out, which causes inconvenience.

Here, as a wireless power transmission method in which a connection portion with an exposed electrode is not needed, an electromagnetic induction method for transmitting power, which uses a coil provided on each of a transmitting side and a receiving side can be given. However, in that case, when the surfaces of the coils on the transmitting side and the receiving side placed to face each other are relatively misaligned, power transfer efficiency is significantly reduced. Accordingly, the relative position of a power transmitting device and a power receiving device included in a device employing such an electromagnetic induction method for transmitting power is limited, which limits layout flexibility.

The present invention is made in view of the foregoing technical background. Thus, it is an object of one embodiment of the present invention to provide a highly reliable light-emitting device. It is a further object of one embodiment of the present invention to provide a lighting device or a display device with a high level of safety and without an exposed electrode. It is a still further object of one embodiment of the present invention to provide a lighting device or a display device with high layout flexibility. It is a yet still further object of one embodiment of the present invention to provide a light-emitting system or a display system to which the light-emitting device or the display device can be applied.

One embodiment of the present invention achieves at least one of the above objects.

Note that in this specification and the like, an EL layer refers to a layer (also referred to as a light-emitting layer) containing at least a light-emitting organic compound or a stack including a light-emitting layer, which is provided between a pair of electrodes of a light-emitting element.

Further, in this specification and the like, a light-emitting device refers to an image display unit, a light-emitting unit, or a light source (including a lighting device). In addition, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a substrate over which a light-emitting element is formed by a chip on glass (COG) method.

In one embodiment of the present invention, a power transmission/reception method using electric field coupling is employed in a light-emitting device such as a lighting device or a display device including an organic EL element. An electrode for receiving power is provided in the light-emitting device including an organic EL element and arranged so as to face an electrode for transmitting power, whereby alternating-current power can be supplied to the light-emitting device. Further, a rectifier circuit may be provided in the light-emitting device to convert received alternating-current power to direct-current power so that the organic EL element is driven.

That is, in one embodiment of the present invention, a light-emitting device includes a rectifier circuit, a light-emitting element which is electrically connected to the rectifier circuit and in which a layer containing a light-emitting organic compound is provided between a pair of electrodes, and a power receiving electrode which is electrically connected to the rectifier circuit and can receive alternating-current power by electric field coupling. The rectifier circuit rectifies alternating-current power received by the power receiving electrode and generates direct-current power for driving the light-emitting element.

Such a light-emitting device can receive drive electric power with the power receiving electrode using electric field coupling. Thus, a connector or a socket with an exposed electrode for receiving power is not necessarily provided and the risks of electric shock and electric leakage can be eliminated, whereby a highly reliable light-emitting device with a high level of safety can be provided.

Since electric field coupling is used for a power transmission/reception method, unlike in an electromagnetic induction method, for example, power transfer efficiency depends on an overlap area of the electrodes. Thus, the sizes of the electrodes are adjusted so that the light-emitting device can be laid out very freely when the light-emitting device is attached to a wall or a ceiling.

Further, two terminals are needed to be drawn out from either end of a coil used as a power receiving electrode in the case of using electromagnetic induction, whereas one terminal is needed to be drawn out from the power receiving electrode in the case of using electric field coupling; thus, a circuit configuration can be simplified.

In the light-emitting device according to one embodiment of the present invention, the rectifier circuit may be formed using a thin film transistor.

When the rectifier circuit of the light-emitting device is formed using a thin film transistor, the rectifier circuit can be provided over the same substrate as an EL element of the light-emitting device. As described above, when a circuit is formed using a thin film transistor formed over a substrate, the number of components can be reduced, which results in reduction in poor connection between the substrate and the components; thus, a highly reliable light-emitting device can be provided. In addition, the circuit formed using a thin film transistor can be provided in a sealed region, which results in decrease in degradation of the transistor; thus, a highly reliable light-emitting device can be provided.

In the light-emitting device according to one embodiment of the present invention, the power receiving electrode may contain a soft magnetic material.

When the power receiving electrode provided in the light-emitting device is formed using a material containing a soft magnetic material such as iron, the light-emitting device can be attached to a wall, a ceiling, or the like by magnetic force and can be easily detached and attached.

In one embodiment of the present invention, a display device includes a rectifier circuit, a plurality of pixels each of which includes a light-emitting element including a layer containing a light-emitting organic compound provided between a pair of electrodes and a transistor connected the light-emitting element, a driver circuit for driving the pixels, a receiver antenna for receiving a video signal, a control device which drives the driver circuit in accordance with the video signal received by the receiver antenna, and a power receiving electrode which is electrically connected to the rectifier circuit and can receive alternating-current power by electric field coupling. The rectifier circuit rectifies alternating-current power received by the power receiving electrode and generates direct-current power for driving the driver circuit and the control device.

The light-emitting device according to one embodiment of the present invention can be applied to a display device including a plurality of pixels. In a display device which includes the receiver antenna for receiving a video signal and a control circuit and the driver circuit for driving the pixels each including a cell transistor and an EL element in accordance with a received signal, a wiring for inputting a video signal is not necessarily provided in addition to a wiring for receiving power; thus, a display device with a high level of safety in which complication due to wirings is avoided can be provided.

In the display device according to one embodiment of the present invention, the power receiving electrode may contain a soft magnetic material.

When the power receiving electrode is formed using a material containing a soft magnetic material such as iron, the display device can be easily detached and attached.

In one embodiment of the present invention, a light-emitting system includes the light-emitting device and a power transmitting device for transmitting power by electric field coupling. The power transmitting device includes a power transmitting electrode which is provided so as to face the power receiving electrode of the light-emitting device.

Thus, the power transmitting electrode of the power transmitting device can be provided for a wall or a ceiling to which the light-emitting device is to be attached and the light-emitting device can be attached to the wall or the ceiling so that the power receiving electrode faces and overlaps with the power transmitting electrode. Accordingly, a light-emitting system with extremely high layout flexibility can be formed.

In one embodiment of the present invention, a light-emitting system includes the light-emitting device including the power receiving electrode which contains a soft magnetic material and a power transmitting device for transmitting power by electric field coupling. The power transmitting device includes a power transmitting electrode which is provided so as to face the power receiving electrode of the light-emitting device and contains a magnetic substance which attracts the power receiving electrode magnetic force.

In the light-emitting system, a soft magnetic material is used for the power receiving electrode and a magnetic substance for attracting the light-emitting device by magnetic force is provided, so that a light-emitting system whose light-emitting device can be easily detached and attached can be provided. Further, the light-emitting device can be attached to the power transmitting electrode so that the distance between the power receiving electrode and the power transmitting electrode can be constant by magnetic force; thus, a light-emitting system which can supply power stably can be provided.

In one embodiment of the present invention, a display system includes the display device and a power transmitting device for transmitting power by electric field coupling. The power transmitting device includes a power transmitting electrode which is provided so as to face the power receiving electrode of the display device.

In one embodiment of the present invention, a display system includes the display device including the power receiving electrode which contains a soft magnetic material and a power transmitting device for transmitting power by electric field coupling. The power transmitting device includes a power transmitting electrode which is provided so as to face the power receiving electrode of the display device and contains a magnetic substance which attracts the power receiving electrode magnetic force.

The display device according to one embodiment of the present invention can also be attached to the surface of a wall; thus, a display system with extremely high layout flexibility can be formed. Further, a soft magnetic material is used for the power receiving electrode, so that a display system which can be easily detached and attached by magnetic force and can supply power stably can be formed.

According to one embodiment of the present invention, a highly reliable light-emitting device can be provided. Further, a lighting device or a display device with a high level of safety and without an exposed electrode can be provided. Furthermore, a lighting device or a display device with high layout flexibility can be provided. In addition, a light-emitting system or a display system to which the light-emitting device or the display device can be applied can be provided.

BRIEF DESCRIPTION OF THE DRAWINGS

In the accompanying drawings:

FIGS. 3A and 3B illustrate a light-emitting device according to one embodiment of the present invention;

FIGS. 4A and 4B illustrate a light-emitting device according to one embodiment of the present invention;

FIGS. 5A and 5B illustrate a light-emitting device according to one embodiment of the present invention;

FIGS. 6A and 6B illustrate a light-emitting device according to one embodiment of the present invention;

DETAILED DESCRIPTION OF THE INVENTION

Figure 1:
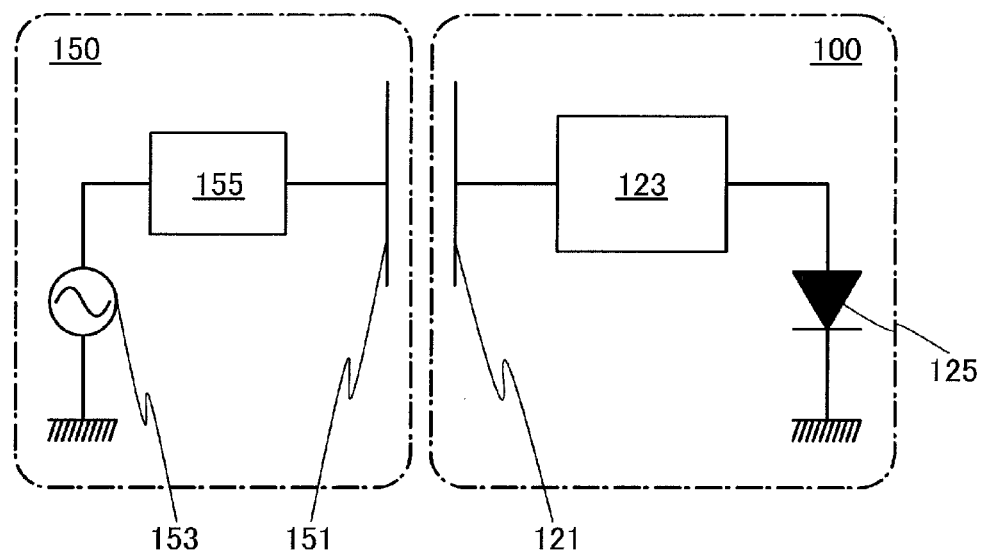
FIG. 1 illustrates a light-emitting device according to one embodiment of the present invention.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures of the present invention described below, the same portions or portions having similar functions are denoted by the same reference numerals in different drawings, and description thereof is not repeated.

Note that in each drawing described in this specification, the size, the layer thickness, or the region of each component is exaggerated for clarity in some cases. Thus, embodiments of the present invention are not limited to such scales.

A transistor is a kind of semiconductor elements and can perform amplification of current or voltage, switching operation for controlling conduction or non-conduction, or the like. A transistor in this specification includes an insulated-gate field-effect transistor (IGFET) and a thin film transistor (TFT).

Functions of a "source" and a "drain" might interchange when a transistor of opposite polarity is used or the direction of current flow is changed in circuit operation, for example. Thus, in this specification, the terms "source" and "drain" can interchange.

In this specification and the like, one of a source and a drain of a transistor is referred to as a "first electrode" and the other of the source and the drain is referred to as a "second electrode" in some cases. Note that in that case, a gate is also referred to as a "gate" or a "gate electrode".

Note that in this specification and the like, two electrodes of a diode are referred to as a "first electrode" and a "second electrode" or a "first terminal" and a "second terminal" in some cases. Here, a direction in which current flows from the first electrode to the second electrode is a forward direction of the diode and its opposite direction is an opposite direction of the diode. In addition, one of the electrodes is simply referred to as a "terminal", "one end", "one", or the like in some cases.

In this specification and the like, two terminals of a coil are referred to as a "first terminal" and a "second terminal" in some cases. In addition, one of the terminals is simply referred to as a "terminal", "one end", "one", or the like in some cases.

In this specification and the like, the term "electrically connected" includes the case where components are connected to each other through an object having any electric action. Here, there is no particular limitation on an object having any electric action as long as electric signals can be transmitted and received between components that are connected to each other through the object. Examples of an "object having any electric action" include a switching element such as a transistor, a resistor, a coil, a capacitor, and an element with a variety of functions in addition to an electrode and a wiring.

Embodiment 1

In this embodiment, a structural example of a light-emitting device in which a power transmission/reception method using electric field coupling is employed according to one embodiment of the present invention will be described with reference to FIG. 1 and FIGS. 2A and 2B.

FIG. 1 illustrates an example of structures of a light-emitting device 100 according to one embodiment of the present invention and a power transmitting device 150. The light-emitting device 100 includes a power receiving electrode 121, a rectifier circuit 123, and a light-emitting element 125.

The power transmitting device 150 transmits power to the light-emitting device 100 using electric field coupling. The power transmitting device 150 includes a power transmitting electrode 151, a high-frequency power source 153, and a matching circuit 155.

As illustrated in FIG. 1, the power transmitting electrode 151 of the power transmitting device 150 is provided so as to face the power receiving electrode 121 of the light-emitting device 100. When a high-frequency voltage is output from the high-frequency power source 153, the high-frequency voltage is induced in the power receiving electrode 121 by electric field coupling. In such a manner, the light-emitting device 100 can receive power.

The high-frequency power source 153 is a power source circuit which can output a predetermined high-frequency voltage (e.g., about several kilohertz to several hundreds of megahertz). A frequency of the high-frequency voltage output from the high-frequency power source 153 is not particularly limited and may be any frequency as long as the light-emitting device 100 can receive the voltage by the power receiving electrode 121 by electric field coupling.

The matching circuit 155 included in the power transmitting device 150 is provided to match the impedance between the power transmitting device 150 and the light-emitting device 100. The matching circuit 155 may be formed in appropriate combination of and elements such as a coil, a capacitor, and a resistor element. As an example of a simple structure, a structure in which coils for matching are connected to each other in series can be given. Note that although the matching circuit 155 is provided in the power transmitting device 150 in this embodiment, one embodiment of the present invention is not limited thereto, and the matching circuit 155 may be provided in one or both of the power transmitting device 150 and the light-emitting device 100.

The rectifier circuit 123 included in the light-emitting device 100 rectifies alternating-current power received by the power receiving electrode 121 and generates direct-current power for driving the light-emitting element 125.

As described above, since the light-emitting device 100 according to one embodiment of the present invention receives power using electric field coupling, the power receiving electrode 121 may have only one terminal. Thus, in the case of using electromagnetic induction, for example, two terminals are needed to be drawn out from either end of a coil used as a power receiving electrode, so that a circuit configuration is complicated. On the other hand, when electric field coupling is used as described above, the power receiving electrode 121 including only one terminal can be used; accordingly, a circuit configuration can be simplified.

The light-emitting element 125 described as an example in this embodiment is an organic EL element in which a layer containing a light-emitting organic compound is provided between a pair of electrodes. The light-emitting element 125 emits light by application of a direct-current voltage generated by the rectifier circuit 123.

Although an organic EL element is used as the light-emitting element 125 in this embodiment, an electroluminescent element which emits light by application of a direct-current voltage can be employed. As examples of such an electroluminescent element, an inorganic EL element, a light emitting diode (LED), and the like can be given.

Figure 2A:
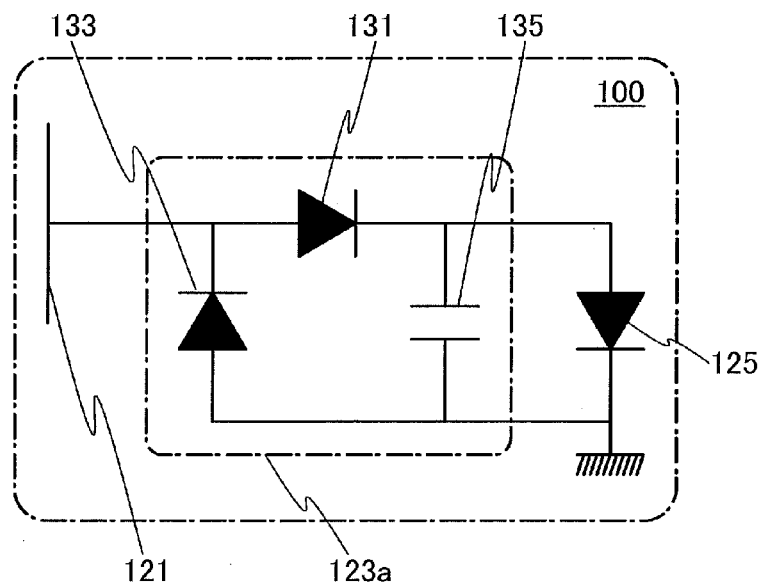
FIGS. 2A and 2B each illustrate the light-emitting device according to one embodiment of the present invention.
Figure 2B:
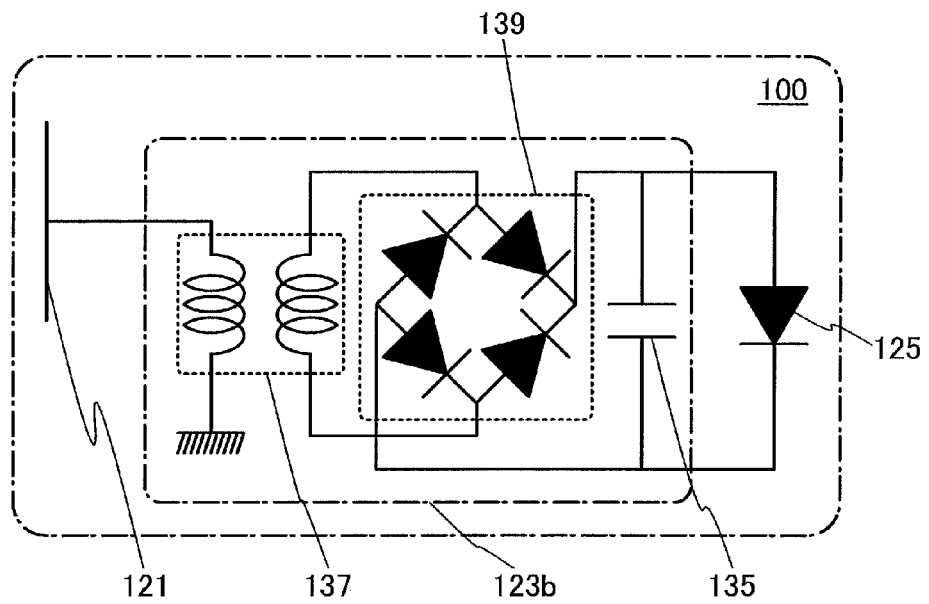

Here, examples of a structure which can be applied to the rectifier circuit 123 are illustrated in FIGS. 2A and 2B.

A rectifier circuit 123a illustrated in FIG. 2A includes diodes 131 and 133 and a capacitor 135. A first electrode of the diode 131 is connected to the power receiving electrode 121 and a second electrode of the diode 133. A second electrode of the diode 131 is connected to a first electrode of the capacitor 135 and a first electrode of the light-emitting element 125. A first electrode of the diode 133, a second electrode of the capacitor 135, and a second electrode the light-emitting element 125 are grounded.

The rectifier circuit 123a is what is called a half-wave rectifier circuit in which only a forward voltage of the diode 131 is output when an alternating-current voltage is input. Further, an output voltage is smoothed by the capacitor 135, so that a stable direct-current voltage can be output. Note that the capacitor 135 is not necessarily provided.

A rectifier circuit 123b illustrated in FIG. 2B includes a transformer 137, a bridge circuit 139, and the capacitor 135. The transformer 137 is connected to the power receiving electrode 121 and two output terminals thereof are connected to the bridge circuit 139. An output terminal of the bridge circuit 139 is connected to the first electrode of the capacitor 135 and the first electrode of the light-emitting element 125.

The transformer 137 includes two coils facing each other. One coil is connected to the power receiving electrode 121 and alternating-current voltages whose phases are inverted from each other are output from either end of another coil. The bridge circuit 139 includes four diodes and rectifies the alternating-current voltage which is input from the transformer 137 to a positive voltage and outputs the voltage.

Accordingly, the rectifier circuit 123b is what is called a full-wave rectifier circuit in which positive and negative alternating-current voltages are converted to positive voltages. Note that similarly to the above, the capacitor 135 is connected in order to generate a stable direct-current voltage by smoothing an output voltage.

A circuit which can applied to the rectifier circuit 123 is not limited to the above circuits, and any rectifier circuit can be used as long as the rectifier circuit converts alternating-current power received by the power receiving electrode 121 to direct-current power. Further, a convertor circuit such as a DC-DC converter, a constant voltage circuit such as a regulator, or a switch such as a transistor which controls power supply to the light-emitting element 125 may be provided between the rectifier circuit 123 and the light-emitting element 125.

Accordingly, the light-emitting device 100 receives power by wireless power transmission using electric field coupling and the light-emitting element 125 in the light-emitting device 100 can emit light. Thus, a connector or a socket with an exposed electrode for receiving power is not necessarily provided and the risks of electric shock and electric leakage at the exposed portion can be eliminated, whereby the light-emitting device can have high reliability and a high level of safety. Further, since electric field coupling is used for a power transmission method, unlike in an electromagnetic induction method, for example, power transfer efficiency depends on an overlap area of the electrodes. Thus, the sizes of the electrodes are adjusted so that the light-emitting device can be laid out very freely when the light-emitting device is attached to a wall or a ceiling.

This embodiment can be combined with any of the other embodiments disclosed in this specification as appropriate.

Embodiment 2

In this embodiment, specific structural examples of a light-emitting device in which a power transmission/reception method using electric field coupling is employed according to one embodiment of the present invention will be described with reference to FIGS. 3A and 3B, FIGS. 4A and 4B, FIGS. 5A and 5B, and FIGS. 6A and 6B.

Structural Example 1

FIG. 3A is a schematic top view of a light-emitting device 200 according to one embodiment of the present invention. FIG. 3B is a schematic cross-sectional view taken along line A-A' in FIG. 3A. The light-emitting device 200 is a top-emission light-emitting device in which light is emitted to a counter substrate 211 side. The counter substrate 211 faces a substrate 201 over which a light-emitting element is provided.

The light-emitting device 200 includes a light-emitting element in which a lower electrode layer 103, an EL layer 105, and an upper electrode layer 107 are stacked, over the substrate 201 over which an insulating layer 217 and an insulating layer 219 are formed. When voltage is applied between the lower electrode layer 103 and the upper electrode layer 107, light emission from the EL layer 105 can be obtained.

Further, wirings 209a, 209b, and 209c are formed over the insulating layer 217.

The light-emitting device 200 has conductivity and includes the substrate 201 whose surface is subjected to insulation treatment. The substrate 201 has a function of the power receiving electrode 121 described as an example in Embodiment 1. Thus, the light-emitting device 200 is provided so that the substrate 201 faces the power transmitting electrode 151 of the power transmitting device 150 described as an example in Embodiment 1, whereby power from the power transmitting device 150 can be received.

As described above, a substrate formed using a conductive material whose surface is subjected to insulation treatment is used as the substrate 201. Thus, the risks of electric shock and electric leakage at an exposed surface having conductivity can be reduced, whereby the light-emitting device 200 can have a high level of safety.

Since the light-emitting device 200 receives power using electric field coupling, the substrate 201 serving as a power receiving electrode of the light-emitting device 200 may be connected to one wiring (the wiring 209a); thus, a device configuration can be simplified significantly as compared to the case where a coil having two terminals is used as a power receiving electrode when electromagnetic induction is used, for example. Note that the number of connection portions between the wiring 209a and the substrate 201 is not limited to one, and a plurality of connection portions may be formed to reduce the contact resistance between the wiring 209a and the substrate 201. In that case, the plurality of connection portions which can be said to have electrically the same potential can be regarded as one terminal.

The insulating layer 217 is formed over the substrate 201 to electrically insulate the substrate 201 from the light-emitting element without fail. The insulating layer 217 can be used as a planarization film which covers the surface unevenness of the substrate 201. Note that in the case where the surface of the substrate 201 is extremely flat and the substrate 201 is sufficiently insulated from the light-emitting element, the insulating layer 217 is not necessarily provided.

Further, the light-emitting device 200 includes an IC chip 215 which has at least the rectifier circuit described as an example in Embodiment 1. One terminal, which is an input terminal, of the IC chip 215 is electrically connected to the substrate 201 through the wiring 209a which is electrically connected to the substrate 201 in an opening provided in an insulating surface of the substrate 201. The other terminal, which is an output terminal, of the IC chip 215 is electrically connected to the lower electrode layer 103 of the light-emitting element through the wiring 209b. The upper electrode layer 107 is electrically connected to the wiring 209c serving as a ground wiring.

The IC chip 215 includes at least the rectifier circuit described as an example in Embodiment 1 and converts alternating-current power received by the substrate 201 to direct-current power for driving the light-emitting element. Note that the IC chip 215 may have a function of a DC-DC converter, a constant voltage circuit such as regulator, or a switch which controls power supply to the light-emitting element, for example. An IC chip having any of the above functions or a switch which controls driving of the light-emitting element may be separately provided in addition to the IC chip 215.

In the light-emitting device 200, the counter substrate 211 is bonded to the substrate 201 so as to face each other with a sealing material 213.

Note that in a sealed region surrounded by the substrate 201, the counter substrate 211, and the sealing material 213, it is preferable that impurities such as oxygen and water be extremely reduced. For example, the sealed region may be filled with an inert gas such as a rare gas or a nitrogen gas or in a reduced pressure state. Alternatively, the sealed region may be filled with a sealant in which impurities such as oxygen and water are reduced.

Note that since the light-emitting device 200 emits light to the counter substrate 211 side, the upper electrode layer 107 and the counter substrate 211 are formed using a material having a property of transmitting light emitted from the EL layer 105. Further, in the case where a sealant is provided over the light-emitting element, the sealant is formed using a light-transmitting material.

The light-emitting device 200 having such a structure receives power by wireless power transmission using electric field coupling and the light-emitting element in the light-emitting device 200 can emit light. Thus, a connector or a socket with an exposed electrode for receiving power is not necessarily provided and the risks of electric shock and electric leakage at the exposed portion can be eliminated, whereby the light-emitting device can have high reliability and a high level of safety. Further, since electric field coupling is used for a power transmission method, unlike in an electromagnetic induction method, for example, power transfer efficiency depends on an overlap area of the electrodes. Thus, the sizes of the electrodes are adjusted so that the light-emitting device can be laid out very freely in a horizontal direction when the light-emitting device is attached to a wall or a ceiling.

Next, a light-emitting device having a structure which is different from that of the above structural example will be described below. Note that description of some portions common to those in Structural Example 1 is omitted.

Structural Example 2

FIG. 4A is a schematic top view of a light-emitting device 220 described in this structural example. FIG. 4B is a schematic cross-sectional view taken along line B-B' in FIG. 4A. The light-emitting device 220 is a bottom-emission light-emitting device in which light is emitted to a substrate 221 side.

The light-emitting device 220 differs from the light-emitting device 200 described as an example in Structural Example 1 in that a conductive substrate serving as a power receiving electrode is used as a counter substrate 231. In addition, a conductive layer 223 for electrically connecting the counter substrate 231 and the wiring 209a is provided over the wiring 209a.

Similarly to the substrate 201 described as an example in Structural Example 1, a conductive substrate whose surface is subjected to insulation treatment is used as the counter substrate 231. Further, an opening is formed in an insulating surface of the counter substrate 231 and the conductive layer 223 which is electrically connected to the counter substrate 231 is formed over the wiring 209a. Thus, the one terminal of the IC chip 215 is electrically connected to the counter substrate 231 through the conductive layer 223 and the wiring 209a.

For the conductive layer 223, for example, a conductive material obtained by backing an organic resin in which conductive particles are dispersed, or a material having an anisotropic conductive property in the direction in which pressure is applied by thermocompression bonding in the process of bonding the substrate 221 and the counter substrate 231, that is, the direction perpendicular to a surface of the substrate 221 on which a layer is formed, may be used. With the use of such a material, the wiring 209a can be electrically connected to the counter substrate 231.

Note that since the light-emitting device 220 emits light to the substrate 221 side, the lower electrode layer 103, the insulating layer 217, the insulating layer 219, and the substrate 221 are formed using a material having a property of transmitting light emitted from the EL layer 105.

A desiccant that absorbs water and the like can be provided between the light-emitting element and the counter substrate 231. When a desiccant is provided, deterioration of the light-emitting element is suppressed, so that the light-emitting device 220 can be highly reliable.

With such a structure, the light-emitting device 220 can be a bottom-emission light-emitting device to which wireless power transmission using electric field coupling is applied.

Although a structure in which an IC chip serving as a rectifier circuit is used are described in Structural Example 1 and Structural Example 2, a rectifier circuit can be formed over a substrate by application of a thin film transistor technique. A structural example of a light-emitting device to which a thin film transistor is applied will be described below.

Structural Example 3

FIG. 5A is a schematic top view of a light-emitting device 240 described in this structural example. FIG. 5B is a schematic cross-sectional view taken along line C-C' in FIG. 5A. The light-emitting device 240 is a top-emission light-emitting device which includes the conductive substrate 201, the light-transmitting counter substrate 211, and a circuit portion 241 including a thin film transistor and the like.

FIG. 5B is a schematic cross-sectional view of a capacitor 245 and a thin film transistor 243 which are included in the circuit portion 241. For example, in the rectifier circuit 123a described as an example in FIG. 2A, the thin film transistor 243 can be applied to the diode 131 or 133, and the capacitor 245 can be applied to the capacitor 135.

The thin film transistor 243 includes a channel region where a channel is formed, a semiconductor layer including a source region and a drain region into which an impurity is introduced, and a gate electrode over the semiconductor layer with an insulating layer provided therebetween. The gate of the thin film transistor 243 is electrically connected to one of the source and the drain of the thin film transistor 243 through a wiring 249a, so that the thin film transistor 243 functions as a diode.

Note that although a diode element is formed using a thin film transistor in this structural example, the diode element is not limited thereto. For example, a PN junction diode, a PIN junction diode, a Schottky bather diode, or the like may alternatively be used.

For the semiconductor layer included in the thin film transistor 243, a known semiconductor material can be used. The semiconductor layer can be formed using any of the following semiconductor materials, for example: a material containing an element belonging to Group 14 of the periodic table, such as silicon (Si) or germanium (Ge), as its main component; a compound such as silicon carbide (SiC), silicon germanium (SiGe), or gallium arsenide (GaAs); an oxide such as zinc oxide (ZnO) or zinc oxide containing indium (In) and gallium (Ga); and an organic compound exhibiting semiconductor characteristics. A stacked structure of layers formed using more than one of these semiconductor materials can also be used.

The capacitor 245 includes a semiconductor layer into which an impurity is introduced, an electrode formed using the same material as that of the gate electrode, and an insulating layer provided therebetween. Note that there is no particular limitation on the structure of the capacitor 245 as long as an insulating material and a conductive material which are included in the circuit portion 241 and the EL element are combined as appropriate.

The light-emitting device 240 further includes an insulating layer 247 which covers the thin film transistor 243 and the capacitor 245. A wiring included in the circuit portion 241 is formed in an opening portion formed in the insulating layer 247. The wiring 249a is electrically connected to the substrate 201 in an opening portion formed in the insulating layer 247, the insulating layer 217, and an insulating surface of the substrate 201. Thus, the substrate 201 is electrically connected to the thin film transistor 243 in the circuit portion 241 through the wiring 249a.

The light-emitting device 240 further includes an insulating layer 251 which covers the circuit portion 241; and a light-emitting element in which the lower electrode layer 103, the EL layer 105, and the upper electrode layer 107 are stacked and which is formed over the insulating layer 251.

Furthermore, similarly to the Structural Example 1, the counter substrate 211 is bonded to the substrate 201 with the sealing material 213 provided on the peripheral portion thereof.

When a circuit in the light-emitting device 240 is formed using a thin film transistor and the like formed over the substrate 201, the number of components of the light-emitting device 240 can be reduced, which results in reduction in poor connection between the substrate 201 and the component; thus, the light-emitting device 240 having such a structure can be a highly reliable light-emitting device. Although the circuit portion 241 is provided below the light-emitting element, light is not blocked by the circuit portion 241 in a top-emission light-emitting device, and thus a large light-emitting area can be provided. Further, since the circuit portion 241 can be provided in a region (sealed region) surrounded by the sealing material 213, the wiring and the like of the circuit portion 241 are not exposed; thus the light-emitting device can have high reliability. Furthermore, the circuit portion 241 can be formed extremely thin by application of a thin film transistor technique; thus the entire light-emitting device 240 can be thin.

Structural Example 4

Lastly, the case where the light-emitting device 240 described as an example in Structural Example 3 which includes the circuit portion including the thin film transistor is applied to a bottom-emission light-emitting device will be described.

FIG. 6A is a schematic top view of a light-emitting device 260 described in this structural example. FIG. 6B is a schematic cross-sectional view taken along line D-D' in FIG. 6A. The light-emitting device 260 is a bottom-emission light-emitting device which includes the circuit portion 241 including the thin film transistor and a light-emitting element over the light-transmitting substrate 221 and in which the conductive counter substrate 231 whose surface is subjected to insulation treatment is bonded to the substrate 221 with the sealing material 213.

In the light-emitting device 260, the conductive counter substrate 231 is connected to the circuit portion 241 through the conductive layer 223.

The EL layer 105 and the upper electrode layer 107 are not provided in a region which overlaps with the circuit portion 241. Thus, a non-light-emitting region is formed in the region which overlaps with the circuit portion 241.

Note that similarly to the light-emitting device 220, a desiccant may be provided in a sealed region.

With such a structure, since the circuit portion 241 can be provided in a region (sealed region) surrounded by the sealing material 213, the wiring and the like of the circuit portion 241 are not exposed; thus the light-emitting device can have high reliability. Further, the circuit portion 241 can be formed extremely thin by application of a thin film transistor technique; thus the entire light-emitting device 260 can be thin.

Note that although a structure in which a conductive substrate whose surface is subjected to insulation treatment is used as a power receiving electrode is described as an example in each structural example in this embodiment, the power receiving electrode is not limited thereto. Any electrode can be used as long as the electrode has conductivity, can be provided so as to face a power transmitting electrode of a power transmitting device, and can receive alternating-current power by electric field coupling. For example, a conductive film formed over a surface of an insulating substrate, a conductive film, a conductive sheet, or the like may be used. Alternatively, the power receiving electrode may be provided inside a sealed region of a light-emitting device. Note that a surface of the power receiving electrode is preferably subjected to insulation treatment because safety is improved.

<Material and Manufacturing Method>

Here, materials which can be used for the components and methods for manufacturing the components will be described. Note that materials are not limited to one described below, and a material having a similar function can be used as appropriate.

[Substrate, Counter Substrate]

A material having a property of transmitting at least light emitted from the light-emitting element is used for the substrate provided on the light-emission side. As the light-transmitting material, for example, glass, quartz, or an organic resin can be used.

In the case where an organic resin is used for the substrate, any of the following can be used as the organic resin, for example: polyester resins such as polyethylene terephthalate (PET) and polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, and the like. A substrate in which a glass fiber is impregnated with an organic resin or a substrate in which an inorganic filler is mixed with an organic resin can also be used.

As the substrate provided on the side opposite to the light-emission side, a substrate formed using a conductive material, which functions as a power receiving electrode, is used. A surface of the conductive substrate is preferably subjected to insulation treatment. For example, the surface of the substrate may be oxidized by an anodic oxidation method or the like to be insulated. Alternatively, an organic resin or the like may be formed over the surface of the substrate by a coating method such as a dipping method or a spin coating. Further alternatively, an inorganic insulating film may be formed over the surface of the conductive substrate by a sputtering method or a CVD method.

A material with high conductivity is preferably used for the conductive substrate. For example, a metal or alloy containing a metal material such as aluminum, copper, iron, or titanium can be used.

In particular, in the case of a top-emission light-emitting device, as the substrate where an EL element is formed, a high-thermal-conductive substrate such as a metal substrate or an alloy substrate is preferably used. In the case of a large lighting device including an EL element, heat from the EL element becomes a problem in some cases; thus, heat dissipation can be increased with the use of such a substrate having high thermal conductivity. For example, when a substrate of aluminum oxide, duralumin, or the like is used other than a stainless steel substrate, light weight and high thermal dissipation can be achieved. A stack of aluminum and aluminum oxide, a stack of duralumin and aluminum oxide, a stack of duralumin and magnesium oxide, or the like is preferably used because the surface of the substrate can have an insulating property.

[Light-Emitting Element]

As a light-transmitting material which can be used for an electrode layer through which light is extracted, indium oxide, indium tin oxide, indium zinc oxide, zinc oxide, zinc oxide to which gallium is added, graphene, or the like can be used.

Alternatively, for the electrode layer, a metal material such as gold, silver, platinum, magnesium, nickel, tungsten, chromium, molybdenum, iron, cobalt, copper, palladium, or titanium, or an alloy of any of these metal materials can be used. Further alternatively, a nitride of the metal material (e.g., titanium nitride) or the like may be used. In the case of using the metal material (or the nitride thereof), the electrode layer may be thinned so as to be able to transmit light.

Alternatively, a stack of films formed using any of the above materials can be used as the electrode layer. For example, a stack of films of indium tin oxide and an alloy of silver and magnesium is preferably used because conductivity can be increased.

The thickness of the electrode layer through which light is extracted is, for example, greater than or equal to 50 nm and less than or equal to 300 nm, preferably greater than or equal to 80 nm and less than or equal to 130 nm, further preferably greater than or equal to 100 nm and less than or equal to 110 nm.

The EL layer includes at least a layer containing a light-emitting organic compound. In addition, the EL layer can have a stacked-layer structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate.

Note that in one embodiment of the present invention, a light-emitting element (tandem light-emitting element) in which a plurality of EL layers is provided between an upper electrode layer and a lower electrode layer can be used. A stacked-layer structure of two layers, three layers, or four layers (in particular, a stacked-layer structure of three layers) is preferably used. In addition, an intermediate layer containing a substance having a high electron transport property, a substance having a high hole transport property, or the like can be included between these EL layers. Structural examples of the EL layer will be described in detail in Embodiment 6.

An electrode layer which is provided on the side opposite to the side from which light is extracted is formed using a reflective material. As the reflective material, a metal such as aluminum, gold, platinum, silver, nickel, tungsten, chromium, molybdenum, iron, cobalt, copper, or palladium can be used. Besides, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given. Aluminum can be used for the material of the electrode layer; however, in that case, the wiring might be corroded when the wiring is provided to be in direct contact with indium tin oxide or the like. Thus, it is preferable that the electrode layer have a stacked-layer structure and that aluminum be used for a layer which is not in contact with indium tin oxide or the like.

Note that a conductive film used for the light-emitting element can be formed by a film formation method such as an evaporation method, a sputtering method, a CVD method, or the like. In addition, the EL layer can be formed by a film formation method such as an evaporation method or a droplet discharge method such as an ink-jet method.

[Insulating Layer]

As a material of the insulating layer, for example, an organic resin such as a polyimide resin, an acrylic resin, a polyamide resin, or an epoxy resin or an inorganic insulating material can be used. For example, the insulating layer is preferably formed in such a manner that a photosensitive organic resin is applied by a spin coating method or the like, and then is subjected to selective light exposure and development. As another formation method, a sputtering method, an evaporation method, a droplet discharge method (e.g., an ink-jet method), a printing method (e.g., a screen printing method or an offset printing method), or the like may be used. An inorganic insulating film having a barrier property to impurities such as water and oxygen, such as a silicon nitride film, is preferably provided between the substrate and the light-emitting element, because diffusion of impurities from the substrate to the light-emitting element can be suppressed.

[Wiring]

The wiring included in a circuit can be formed in such a manner that a conductive film is formed by a film formation method such as a sputtering method or a CVD method, and then is selectively etched. A conductive material which is used for the light-emitting element can be used as appropriate for the conductive film. Alternatively, the wiring may be formed by a plating method.

In the case of forming the wiring by a printing method such as a screen printing method, a conductive paste in which conductive particles having a diameter of several nanometers to several tens of micrometers are dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like; fine particles of silver halide; or dispersible nanoparticles can be used. As the organic resin included in the conductive paste, one or more selected from organic resins serving as a binder of metal particles, a solvent, a dispersing agent and a coating material can be used. Organic resins such as an epoxy resin and a silicone resin can be given as representative examples. Further, in forming a conductive film, the conductive paste is preferably baked after being printed.

[Sealing Material]

A known material can be used for the sealing material. For example, a thermosetting material or a UV curable material may be used. Alternatively, an epoxy resin of a two-component-mixture type may be used. For the sealing material, a material capable of bonding inorganic materials, organic materials, or an inorganic material and an organic material is used in accordance with an adhesion site. Further, it is desirable that a material used for the sealing material allow as little moisture and oxygen as possible to penetrate through.

Furthermore, a desiccant may be contained in the sealing material. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the desiccant.

The sealing material can be formed by a printing method such as a screen printing method, a droplet discharge method such as an ink-jet method, or a coating method such as a dispenser method.

[Sealant]

For the sealant, an inorganic material, an organic material, or a combination thereof which have properties of transmitting light emitted from the EL element can be used, or a stack of these materials can be used as appropriate. Further, it is preferable that a refractive index of the sealant to the light emission be adjusted as described above. In addition, it is preferable that a material used for the sealant allow as little moisture and oxygen as possible to penetrate through, similar to the sealing material. The same material may be used for the sealant and the sealing material.

The sealant can be formed by a film formation method such as a sputtering method or a CVD method, or a printing method, a droplet discharge method, or a coating method, similar to the sealing material.

[Conductive Layer]

A conductive paste or the like containing conductive particles of silver, copper, or the like can be used for the conductive layer. By baking the conductive paste, the conductive layer can be formed. Alternatively, a thermosetting resin mixed with conductive metal particles may be used for the conductive layer. As the metal particles, particles in which two or more kinds of metals are layered, for example, Ni particles which are covered with Au are preferably used. The diameter of the metal particle is greater than or equal to 100 nm and less than or equal to 100 μm, preferably greater than or equal to 1 μm and less than or equal to 50 μm. Either a paste material or a sheet material can be used for the conductive layer.

The conductive layer formed using such a material is provided between electrodes and the conductive layer and the electrodes are applied with pressure and bonded while being heated, and thus, the metal particles are in contact with each other in the pressure direction. In this manner, a conductive path is formed. On the other hand, an insulating property is maintained by the resin in a direction perpendicular to the pressure direction. As a result, an anisotropic conductive property is exhibited. The conductive layer can be formed by a printing method, a droplet discharge method, or a coating method, similar to the sealing material. In addition, in the case where a sheet material is used for the conductive layer, the material can be directly bonded to a desired position.

This embodiment can be combined with any of the other embodiments disclosed in this specification as appropriate.

Embodiment 3

In this embodiment, examples of a light-emitting system in which any of the light-emitting devices and the power transmitting device transmitting power which are described above as examples are combined will be described with reference to FIGS. 7A to 7C.

Figure 7A:
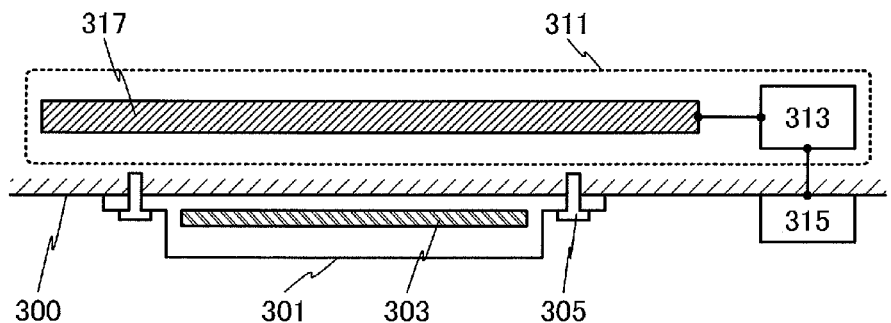
FIGS. 7A to 7C each illustrate a light-emitting system according to one embodiment of the present invention.

FIG. 7A is a schematic view of the structure of a light-emitting system which includes a power transmitting device 311 provided on the inner side than a ceiling surface 300 and a light-emitting device 301 fixed to the ceiling surface 300.

On the inner side than the ceiling surface 300, the power transmitting device 311 including a power transmitting electrode 317 arranged parallel to the ceiling surface 300 and a power source portion 313 connected to the power transmitting electrode is provided.

The structure of the power transmitting device described as an example in Embodiment 1 can be applied to the power transmitting device 311 which applies a high-frequency voltage output from the power source portion 313 to the power transmitting electrode 317. Note that the power source portion 313 includes at least a high-frequency power source and may also include a circuit such as a matching circuit.

The power source portion 313 is connected to a control portion 315 provided on the outer side than the ceiling surface 300. The control portion 315 at least has a function of controlling on and off of the power source portion 313. A light receiving portion for receiving infrared rays or the like may be provided for a surface of the control portion 315 to receive a signal from a remote controller or the like so that the power source portion 313 is controlled. Alternatively, the level of power from the power source portion 313 may be varied to control power received by the light-emitting device 301 so that adjustment of light-emission from the light-emitting device 301 is controlled.

The light-emitting device 301 is fixed to the ceiling surface 300 with a fixture 305 so that a power receiving electrode 303 faces the power transmitting electrode 317. Note that any of the light-emitting devices described as examples in the above embodiments can be applied to the light-emitting device 301.

Since the light-emitting device 301 is fixed to and is in contact with the ceiling surface 300, the distance between the power receiving electrode 303 and the power transmitting electrode 317 arranged parallel to the ceiling surface 300 is constant. Thus, the light-emitting device 301 can receive the same level of power in any position on the ceiling surface 300 as long as the ends of the power receiving electrode 303 are positioned on the inner side than the ends of the power transmitting electrode 317. Accordingly, a light-emitting system with extremely high layout flexibility can be provided by combination of the light-emitting device 301 and the power transmitting device 311.

Further, when the power receiving electrode 303 included in the light-emitting device 301 is formed using a soft magnetic material, a light-emitting system with higher layout flexibility can be obtained. The case where a soft magnetic material is used for a power receiving electrode will be described below.

Figure 7B:
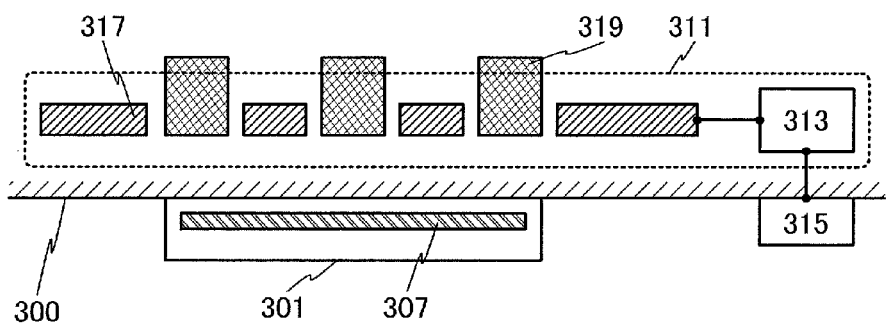

In FIG. 7B, a plurality of opening portions are provided in the power transmitting electrode 317 and a magnetic substance 319 is provided in each of the openings. Further, a power receiving electrode 307 of the light-emitting device 301 is formed using a soft magnetic material.

There is no particular limitation on the magnetic substance 319 as long as the magnetic substance 319 is a ferromagnetic substance which shows spontaneous magnetization under the operating temperature conditions. For example, a cast alnico magnet, a sintered alnico magnet, a ferrite magnet, a FeCrCo magnet, a rare-earth-cobalt magnet such as a samarium-cobalt (SmCo) magnet, a neodymium-iron-boron-based magnet (including a neodymium-iron-boron magnet), and the like can be given.

As a soft magnetic material which can be used for the power receiving electrode 307, a material containing iron, cobalt, manganese, or the like can be used. For example, SUS430 which is ferritic stainless steel or SUS420J2 which is martensite stainless steel can be used. There is no particular limitation on materials used for the magnetic substance 319 and the power receiving electrode 307 as long as the light-emitting device 301 including the power receiving electrode 307 is attracted to the magnetic substance 319 so that the light-emitting device 301 is not detached or dropped unintentionally while the light-emitting device 301 is used.

As described above, when the power receiving electrode 307 of the light-emitting device 301 is formed using a soft magnetic material and is attracted to the magnetic substance 319 provided on the inner side than the ceiling surface 300 so that the light-emitting device 301 is fixed, the light-emitting device 301 can be easily detached and attached and can be laid out very freely.

Even when a soft magnetic material cannot be used for the power receiving electrode 307 of the light-emitting device 301, when a soft magnetic substance or a magnetic substance such as a magnet is provided in the light-emitting device 301 or a soft magnetic material is used for a housing, the light-emitting device 301 can be attached to the ceiling surface 300 by magnetic force.

Figure 7C:
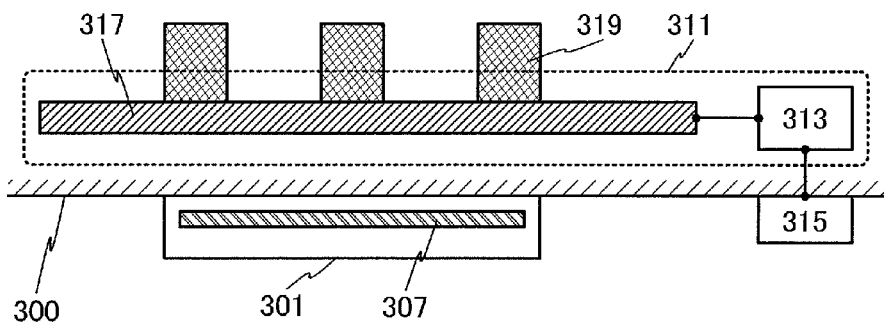

Note that as illustrated in FIG. 7C, the magnetic substance 319 may be in contact with the power transmitting electrode 317 formed using the above soft magnetic material so that the power transmitting electrode 317 is magnetized. With such a structure, attractive force between the power transmitting electrode 317 and the power receiving electrode 307 can be constant regardless of the relative position of the magnetic substance 319 and the light-emitting device 301; thus, the light-emitting device 301 can be laid out freely. Further, since an opening is not necessarily formed in the power transmitting electrode 317, an area of a region where electrodes face each other can be increased, and thus power transfer efficiency can be improved.

Although a structure in which the light-emitting device 301 is provided for the ceiling surface 300 is described above, the structure is not limited thereto and the light-emitting device 301 can also be provided for a flat surface of a structure body such as a surface of a wall, a ceiling surface, or a floor of a building. The light-emitting device 301 can also be attached to a top surface, side surface, or bottom surface of a piece of furniture such as a table or a shelf. In the case where the light-emitting device 301 has flexibility, the light-emitting device 301 can be provided for a structural body having a curved surface, such as a pillar.

This embodiment can be combined with any of the other embodiments disclosed in this specification as appropriate.

Embodiment 4

Any of the light-emitting devices according to embodiments of the present invention described as examples in the above embodiments can be applied to a display device including a plurality of pixels. Hereinafter, structural examples of display devices according to embodiments of the present invention will be described with reference to FIG. 8 and FIG. 11.

Figure 8:
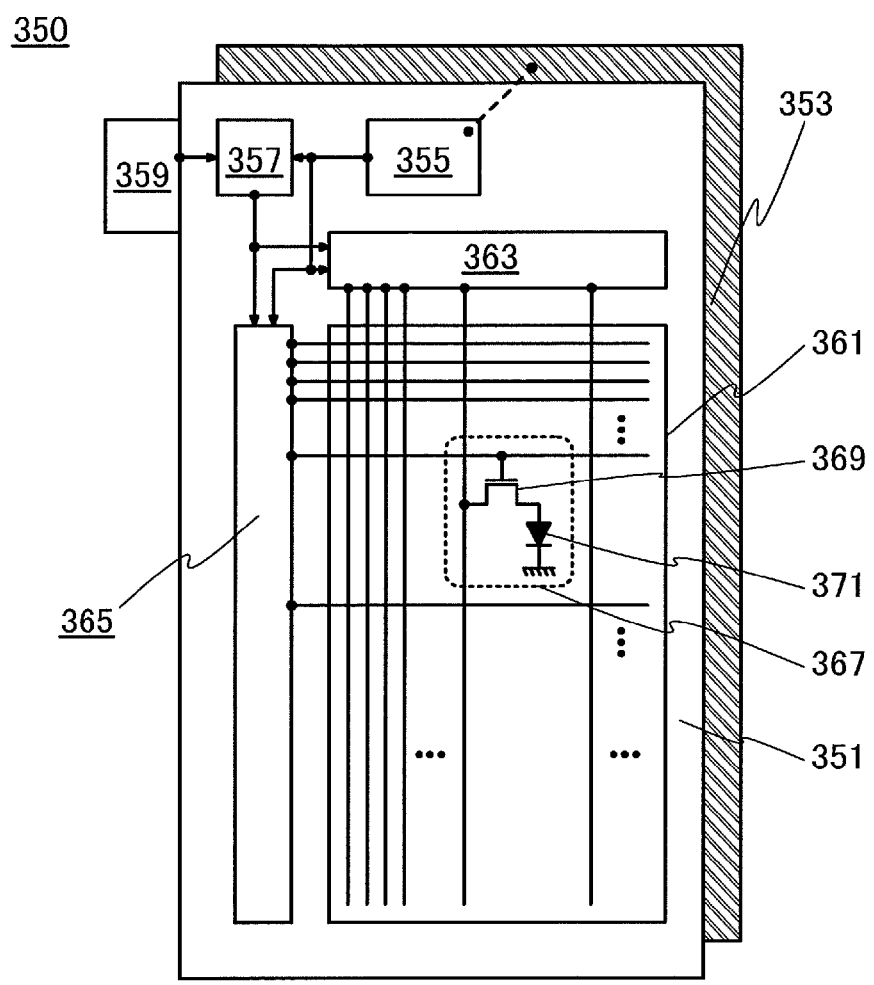
FIG. 8 illustrates a display device according to one embodiment of the present invention.

A display device 350 illustrated in FIG. 8 includes, over a substrate 351, a rectifier circuit 355, a control circuit 357, a display area 361 including a plurality of pixels 367, a signal line driver circuit 363, and a scan line driver circuit 365. Further, the display device 350 includes a power receiving electrode 353 which is electrically connected to the rectifier circuit 355. Furthermore, a receiver antenna 359 for receiving a video signal is electrically connected to the control circuit 357.

The rectifier circuit 355 which is electrically connected to the power receiving electrode 353 rectifies alternating-current power received by the power receiving electrode 353 and generates direct-current power for driving each circuit in the display device 350. The rectifier circuit described as an example in Embodiment 1 can be applied to the rectifier circuit 355. The rectifier circuit 355 supplies power to the control circuit 357, the signal line driver circuit 363, and the scan line driver circuit 365.

The control circuit 357 drives the signal line driver circuit 363 and the scan line driver circuit 365 in accordance with a video signal received by the receiver antenna 359, so that an image is displayed on the display area 361. The control circuit 357 includes, for example, a demodulation circuit which demodulates a signal received by the receiver antenna 359, a timing controller, and the like.

The display area 361 includes the plurality of pixels 367 arranged in a matrix. The pixel 367 has a structure in which at least a selection transistor 369 and a light-emitting element 371 are connected to each other in series. The light-emitting element described as an example in the above embodiment can be applied to the light-emitting element 371. Further, a known thin film transistor typified by the thin film transistor described as an example in the above embodiment can be applied to the selection transistor 369.

The signal line driver circuit 363 and the scan line driver circuit 365 drive each of the pixels 367 in the display area 361 in accordance with a signal from the control circuit 357, so that an image is displayed. The signal line driver circuit 363 and the scan line driver circuit 365 each include a switch, a multiplexer, a shift register circuit, a decoder circuit, an inverter circuit, a buffer circuit, a level shifter circuit, and the like. Each of the signal line driver circuit 363 and the scan line driver circuit 365 preferably includes a thin film transistor.

Figure 11:
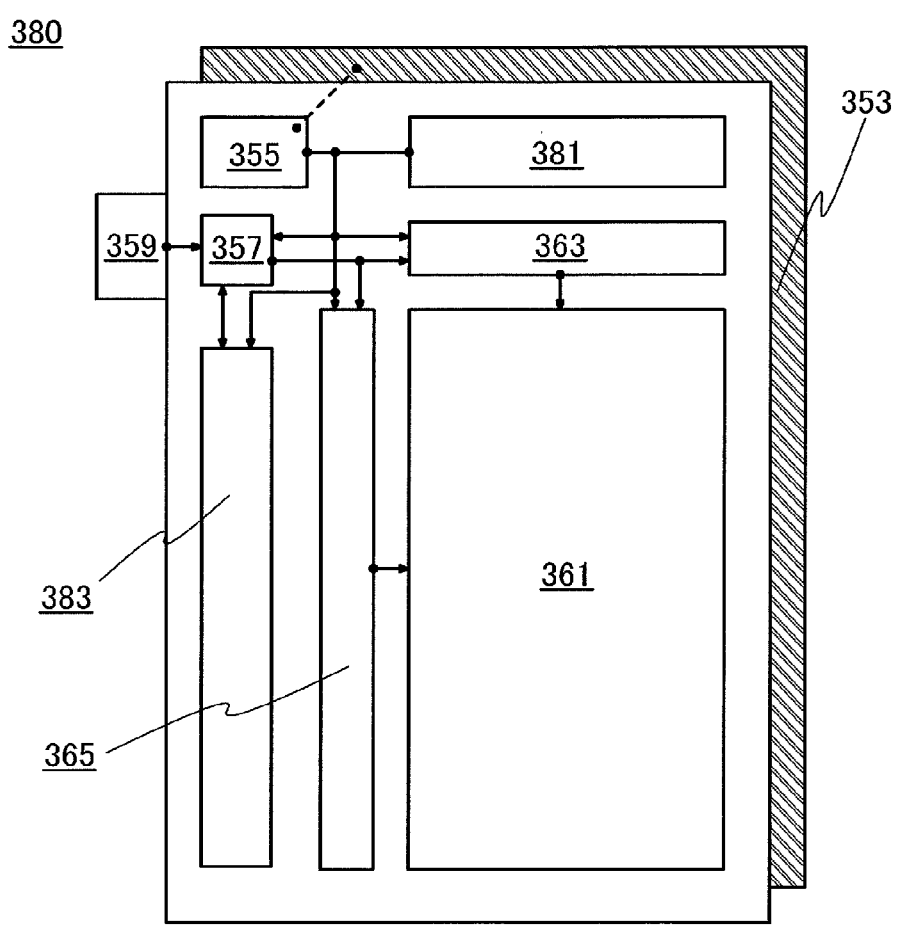
FIG. 11 illustrates a display device according to one embodiment of the present invention.

A display device 380 illustrated in FIG. 11 includes a power storage device 381 which can store received power and a storage device 383 which can store image data, in addition to the display device 350.

The power storage device 381 which is connected to the rectifier circuit 355 stores direct-current power rectified by the rectifier circuit 355 and supplies the power to each circuit when needed.

A secondary battery, a capacitor, or the like can be used as the power storage device 381. A sheet-like battery is preferably used. When a lithium battery, preferably a lithium polymer battery formed using a gel electrolyte, a lithium ion battery, or the like is used, for example, miniaturization is possible. As the power storage device 381, a chargeable and dischargeable battery such as a nickel metal hydride battery, a nickel-cadmium battery, an organic radical battery, a lead-acid battery, an air secondary battery, a nickel-zinc battery, or a silver-zinc battery; a high-capacity capacitor; or the like may also be used.

The storage device 383 which is connected to the control circuit 357 can store image data which is converted from a video signal received by the receiver antenna 359 by the control circuit 357, when needed. Further, the control circuit 357 can read the image data stored in the storage device 383 so that an image is displayed, when needed.

The storage device 383 includes memory elements such as a nonvolatile memory element and a volatile memory element and data writing and data reading to and from those elements can be performed. As the memory element, for example, a volatile memory element such as a dynamic random access memory (DRAM) or a static random access memory (SRAM) or a nonvolatile memory element such as a flash memory, an electrically erasable and programmable read only memory (EEPROM), or a ferroelectric random access memory (FeRAM) can be used. The storage device 383 may include a slot in which a small memory medium or the like can be inserted so that data writing and data reading to and from the memory medium can be performed.

Note that the display device may additionally include a speaker or the like to output sound.

The display device described as an example in this embodiment can be freely provided for a wall or a ceiling in which a power transmitting device is embedded as described in Embodiment 3. Further, when a flexible material is used for a substrate or a counter substrate, the display device can be provided for a side surface of a structural body having a curved surface such as a columnar structural body; thus, the display device can have extremely high layout flexibility and an excellent design. Furthermore, when a soft magnetic material is used for the power receiving electrode, the display device can be freely attached by magnetic force.

A display device having such a structure can receive power by a power transmission/reception method using electric field coupling. Further, the display device can also receive a video signal by a receiver antenna. Accordingly, a wiring for receiving power or for inputting a video signal and a connector are not necessary for the display device, and the risks of electric shock and electric leakage are reduced; thus, the display device can have a high level of safety. Further, since the wiring is not necessary, the display device can have extremely high layout flexibility and an excellent design.

This embodiment can be combined with any of the other embodiments disclosed in this specification as appropriate.

Embodiment 5

In this embodiment, application examples of lighting devices and display devices to which the light-emitting devices described as examples in the above embodiments are applied will be described with reference to FIGS. 9A and 9B.

In this embodiment, a lighting device whose light-emitting portion has a curved surface can be provided. Such a lighting device can be applied to lighting in a car; for example, the lighting device or the display device can be provided for a dashboard, a ceiling, or the like.

Figure 9A:
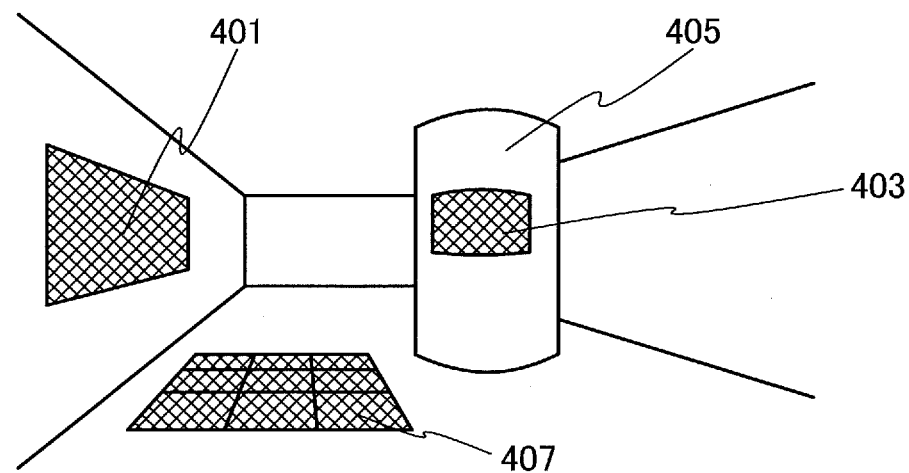
FIGS. 9A and 9B each illustrate application examples of a light-emitting device and a display device according to one embodiment of the present invention.

FIG. 9A illustrates examples in which the light-emitting devices according to one embodiment of the present invention are applied to a commercial lighting and display. A display device 401 is a display device which is provided on a wall of a passage and displays an image such as an advertisement. A flexible display device 403 is provided on a side surface of a columnar pillar 405 and can display an image such as an advertisement as similar to the display device 401. A plurality of lighting devices 407 are arranged in a tile pattern on a floor so that planar light-emission can be obtained.

Figure 9B:
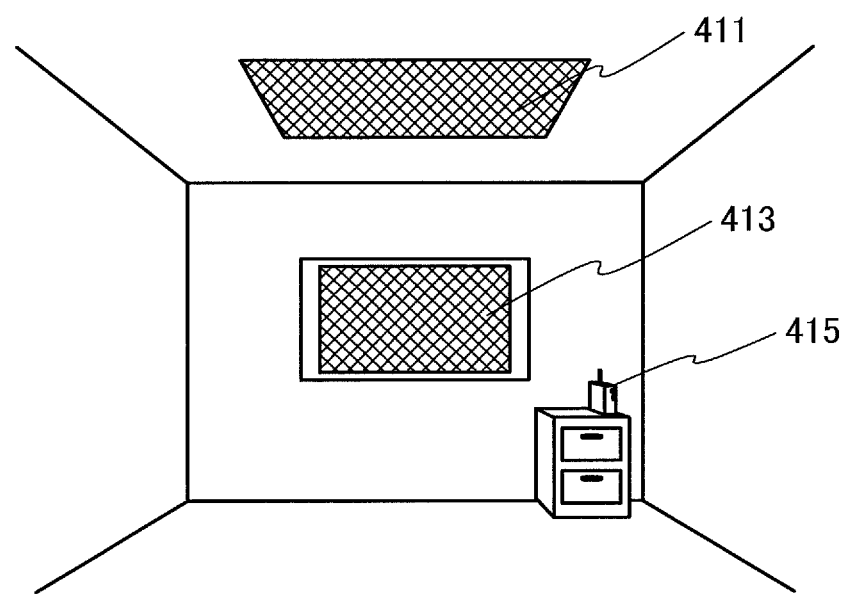

FIG. 9B illustrates examples in which the light-emitting devices according to one embodiment of the present invention are used indoors. Since the light-emitting device can have a larger area, the light-emitting device can be used as a lighting device having a large area. Further, since the light-emitting device is thin, the light-emitting device can be mounted on a wall. A lighting device 411 is provided on a ceiling in a room. A display device 413, which is provided on a wall in the room, can receive a video signal transmitted from a transmitter 415 so that an image can be displayed.

The light-emitting device according to one embodiment of the present invention is applied to the above lighting device and the above display device. Further, a power transmitting device is provided on the inner side than the surface on which the lighting device or the display device is provided. Thus, power can be supplied without a wiring or a connector, whereby the lighting device and the display device can have high layout flexibility and a high level of safety.

As described above, in one embodiment of the present invention, a lighting device or display device having a curved surface or a lighting device or display device including a flexible lighting portion or light-emitting portion can be provided. The use of a flexible light-emitting device for a lighting device or a display device as described above not only improves the degree of freedom in design of the lighting device or the display device but also enables the lighting device or the display device to be provided for a structure having a curved surface.

Embodiment 6

In this embodiment, an example of an EL layer which can be applied to one embodiment of the present invention will be described with reference to FIGS. 10A to 10C.

Figure 10A:
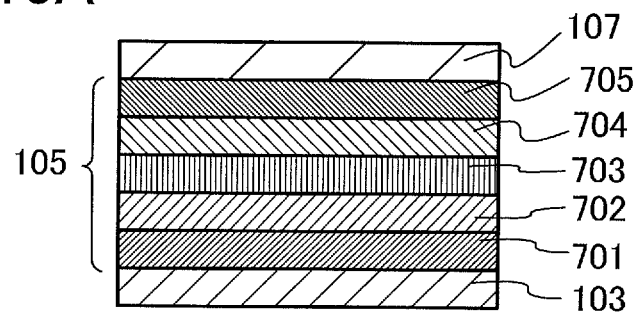
FIGS. 10A to 10C each illustrate an EL layer according to one embodiment of the present invention.

As illustrated in FIG. 10A, the EL layer 105 is provided between the lower electrode layer 103 and the upper electrode layer 107. The lower electrode layer 103 and the upper electrode layer 107 can have structures similar to those of the lower electrode layer and the upper electrode layer in any of the above embodiments.

A light-emitting element including the EL layer 105 described as an example in this embodiment can be used in any of the light-emitting devices described as examples in the above embodiments.

The EL layer 105 includes at least a light-emitting layer containing a light-emitting organic compound. In addition, the EL layer 105 can have a stacked-layer structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. In this embodiment, in the EL layer 105, a hole injection layer 701, a hole transport layer 702, a layer 703 containing a light-emitting organic compound, an electron transport layer 704, and an electron injection layer 705 are stacked in that order from the lower electrode layer 103 side. Note that the stacking order may be inversed.

A method for manufacturing the light-emitting element illustrated in FIG. 10A will be described.

The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$) or copper(II) phthalocyanine (abbreviation: CuPc) can also be used.

Alternatively, an aromatic amine compound which is a low molecular organic compound, or the like can be used.

Further alternatively, a high molecular compound (e.g., an oligomer, a dendrimer, or a polymer) can be used. A high molecular compound to which acid is added can also be used.

In particular, for the hole injection layer 701, a composite material in which an organic compound having a high hole transport property is mixed with an acceptor substance is preferably used. With the use of the composite material in which a substance having a high hole transport property is mixed with an acceptor substance, excellent hole injection from the lower electrode layer 103 can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the lower electrode layer 103 to the EL layer 105 is facilitated.

As the organic compound for the composite material, any of a variety of compounds such as an aromatic amine compound, a carbazole derivative, aromatic hydrocarbon, and a high molecular compound (e.g., an oligomer, a dendrimer, and a polymer) can be used. The organic compound used for the composite material is preferably an organic compound having a high hole transport property. Specifically, a substance having a hole mobility of $10^{-6}$ cm$^2$/V·s or higher is preferably used. Note that any other substance may be used as long as the hole transport property thereof is higher than the electron transport property thereof.

As the organic compound that can be used for the composite material, an aromatic amine compound, a carbazole derivative, or an aromatic hydrocarbon compound having a high hole mobility can be used.

Examples of an electron acceptor include an organic compound and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting properties. Among these, molybdenum oxide is particularly preferable because it is stable in the air, has a low hygroscopic property, and is easily handled.

The composite material may be formed using the high molecular compound and the above electron acceptor and used for the hole injection layer 701.

The hole transport layer 702 is a layer containing a substance having a high hole transport property. As the substance having a high hole transport property, an aromatic amine compound can be used, for example. The substance is mainly one that has a hole mobility of $10^{-6}$ cm$^2$/V·s or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative, an anthracene derivative, or a high molecular compound having a high hole transport property may be used.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which the light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

As the host material, plural kinds of materials can be used. For example, in order to suppress crystallization, a substance which suppresses crystallization may be added. In addition, a different kind of substance may be further added in order to efficiently transfer energy to a guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can also be used.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The electron transport layer 704 is a layer containing a substance having a high electron transport property. The substance having a high electron transport property is mainly one that has an electron mobility of $10^{-6}$ cm$^2$/V·s or higher. The electron transport layer is not limited to a single layer and may be formed of a stack of two or more layers containing the above substance.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. The above substance for forming the electron transport layer 704 can also be used.

Note that the hole injection layer 701, the hole transport layer 702, the layer 703 containing a light-emitting organic compound, the electron transport layer 704, and the electron injection layer 705 which are described above can each be formed by an evaporation method (e.g., a vacuum evaporation method), an ink-jet method, a coating method, or the like.

Figure 10B:
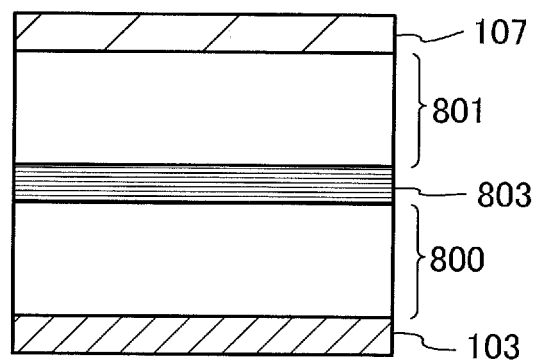

Note that a plurality of EL layers may be stacked between the lower electrode layer 103 and the upper electrode layer 107 as illustrated in FIG. 10B. In that case, a charge generation layer 803 is preferably provided between a first EL layer 800 and a second EL layer 801 which are stacked. The charge generation layer 803 can be formed using the above-mentioned composite material. The charge generation layer 803 may have a stacked-layer structure including a layer containing the composite material and a layer containing another material. In that case, as the layer containing another material, a layer containing an electron donating substance and a substance having a high electron transport property, a layer formed using a transparent conductive film, or the like can be used. As for a light-emitting element having such a structure, problems such as energy transfer and quenching are less likely to occur, and thus a light-emitting element which has both high light luminous efficiency and long lifetime can be easily obtained owing to expansion in the choice of materials. Moreover, a light-emitting element which provides phosphorescence from one EL layer and fluorescence from another EL layer can be readily obtained. Note that this structure can be combined with the above-mentioned structures of the EL layer.

Further, by forming EL layers to emit light of different colors from each other, light emission of a desired color can be obtained from the light-emitting element as a whole. For example, in a light-emitting element including two EL layers, the emission color of a first EL layer and the emission color of a second EL layer are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more EL layers.

Figure 10C:
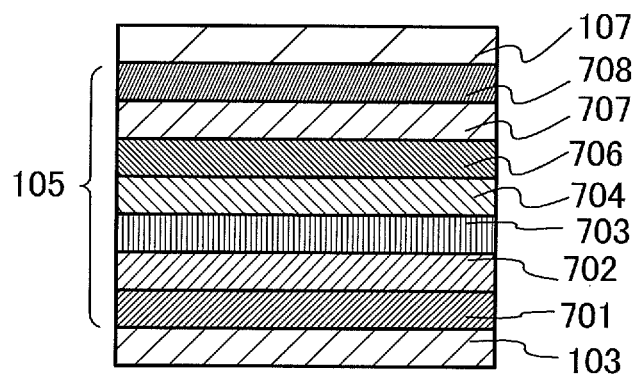

As illustrated in FIG. 10C, the EL layer 105 may include the hole injection layer 701, the hole transport layer 702, the layer 703 containing a light-emitting organic compound, the electron transport layer 704, an electron injection buffer layer 706, an electron relay layer 707, and a composite material layer 708 which is in contact with the upper electrode layer 107, between the lower electrode layer 103 and the upper electrode layer 107.

It is preferable to provide the composite material layer 708 which is in contact with the upper electrode layer 107 because damage caused to the EL layer 105 particularly when the upper electrode layer 107 is formed by a sputtering method can be reduced. The composite material layer 708 can be formed using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having a high electron injection property can be used for the electron injection buffer layer 706: an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is provided between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably higher than or equal to −5.0 eV, more preferably higher than or equal to −5.0 eV and lower than or equal to −3.0 eV.

As the substance having a high electron transport property contained in the electron relay layer 707, a phthalocyanine-based material or a metal complex having a metal-oxygen bond and an aromatic ligand is preferably used.

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. In particular, a material having a high acceptor property, in which a metal-oxygen double bond is more likely to act on another molecular in terms of a molecular structure is preferably used.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, in addition to the material described above as the substance having a high electron transport property, a substance having a LUMO level higher than the acceptor level of the acceptor substance contained in the composite material layer 708 can be used. Specifically, it is preferable to use a substance having a LUMO level of higher than or equal to −5.0 eV, more preferably higher than or equal to −5.0 eV and lower than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the layer 703 containing a light-emitting organic compound, and the electron transport layer 704 may each be formed using any of the above materials.

In the above manner, the EL layer 105 according to this embodiment can be formed.

This embodiment can be combined with any of the other embodiments disclosed in this specification as appropriate.

This application is based on Japanese Patent Application serial no. 2011-091087 filed with Japan Patent Office on Apr. 15, 2011, the entire contents of which are hereby incorporated by reference.

What is claimed is:

1. A light-emitting device comprising:
    a power receiving electrode;
    a light-emitting element in a sealed volume and overlapping with the power receiving electrode, the light-emitting element comprising a layer including a light-emitting organic compound; and
    a rectifier circuit electrically connected between the power receiving electrode and the light-emitting element,
    wherein the power receiving electrode is configured to induce a voltage by electric field coupling,
    wherein the rectifier circuit comprises only one terminal electrically connected to the power receiving electrode,
    wherein the rectifier circuit is configured to rectify alternating-current power received by the power receiving electrode and to generate direct-current power for driving the light-emitting element,
    wherein the power receiving electrode comprises a plate-like shaped conductive substrate,
    wherein the sealed volume is defined by a first substrate, a second substrate facing the first substrate, and a sealing material between the first substrate and the second substrate, and
    wherein the plate-like shaped conductive substrate is one of the first substrate and the second substrate.

2. The light-emitting device according to claim 1, wherein the rectifier circuit comprises a thin film transistor.

3. The light-emitting device according to claim 1, wherein the power receiving electrode includes a soft magnetic material.

4. A light-emitting system comprising:
    the light-emitting device according to claim 3;
    a power transmitting device configured to transmit power by electric field coupling, the power transmitting device comprising a power transmitting electrode; and
    a magnetic substance configured to attract the power receiving electrode,
    wherein the power receiving electrode is provided to face the power transmitting electrode when receiving power.

5. The light-emitting system according to claim 4, wherein the power transmitting device is set in a wall, a ceiling, or a floor.

6. The light-emitting system according to claim 4, wherein:
    the power receiving electrode is flexible; and
    the light-emitting device is capable of being attached to a curved surface of a wall, a ceiling, or a floor.

7. The light-emitting device according to claim 3, wherein the light-emitting device is capable of being attached to a power transmitting device by a magnetic force between the light-emitting device and the power transmitting device.

8. The light-emitting device according to claim 3, wherein the soft magnetic material is iron.

9. A light-emitting system comprising:
    the light-emitting device according to claim 1; and
    a power transmitting device configured to transmit power by electric field coupling, the power transmitting device comprising a power transmitting electrode,
    wherein the power receiving electrode is provided to face the power transmitting electrode when receiving power.

10. The light-emitting device according to claim 1,
    wherein the plate-like shaped conductive substrate constitutes the second substrate, and is over the sealing material and the light-emitting element, and
    wherein the rectifier circuit is provided over the first substrate.

11. The light-emitting device according to claim 1,
    wherein the plate-like shaped conductive substrate constitutes the first substrate,
    wherein the light-emitting element is provided on the first substrate, and
    wherein the rectifier circuit is included in an IC chip mounted on the first substrate.

12. A display device comprising:
    a power receiving electrode;
    a light-emitting element in a sealed volume and overlapping with the power receiving electrode, the light-emitting element comprising a layer including a light-emitting organic compound;
    a rectifier circuit electrically connected between the power receiving electrode and the light-emitting element; a pixel comprising a transistor electrically connected to the light-emitting element; and
    a driver circuit configured to drive the pixel,
    wherein the power receiving electrode is configured to induce a voltage by electric field coupling,
    wherein the rectifier circuit comprises only one terminal electrically connected to the power receiving electrode,
    wherein the rectifier circuit is configured to rectify alternating-current power received by the power receiving electrode and to generate direct-current power for driving the light-emitting element,
    wherein the power receiving electrode comprises a plate-like shaped conductive substrate,
    wherein the sealed volume is defined by a first substrate, a second substrate facing the first substrate, and a sealing material between the first substrate and the second substrate, and
    wherein the plate-like shaped conductive substrate is one of the first substrate and the second substrate.

13. The display device according to claim 12, wherein the rectifier circuit comprises another thin film transistor.

14. The display device according to claim 12, wherein the power receiving electrode includes a soft magnetic material.

15. A display system comprising:
    the display device according to claim 14;
    a power transmitting device configured to transmit power by electric field coupling, the power transmitting device comprising a power transmitting electrode; and
    a magnetic substance configured to attract the power receiving electrode,
    wherein the power receiving electrode is provided to face the power transmitting electrode when receiving power.

16. The display system according to claim 15, wherein the power transmitting device is set in a wall, a ceiling, or a floor.

17. The display system according to claim 15, wherein:
    the power receiving electrode is flexible; and
    the display device is capable of being attached to a curved surface of a wall, a ceiling, or a floor.

18. The display device according to claim 14, wherein the display device is capable of being attached to a power transmitting device by a magnetic force between the display device and the power transmitting device.

19. The display device according to claim 14, wherein the soft magnetic material is iron.

20. A display system comprising:
the display device according to claim 12; and
a power transmitting device configured to transmit power by electric field coupling, the power transmitting device comprising a power transmitting electrode,
wherein the power receiving electrode is provided to face the power transmitting electrode when receiving power.

21. The display device according to claim 12, further comprising:
an antenna configured to receive a video signal; and
a control device configured to drive the driver circuit in accordance with a video signal received by the antenna.

22. The display device according to claim 12,
wherein the plate-like shaped conductive substrate constitutes the second substrate, and is over the sealing material and the light-emitting element, and
wherein the rectifier circuit is provided over the first substrate.

23. The display device according to claim 12,
wherein the plate-like shaped conductive substrate constitutes the first substrate,
wherein the light-emitting element is provided on the first substrate, and
wherein the rectifier circuit is included in an IC chip mounted on the first substrate.

24. A light-emitting device comprising:
a power receiving electrode; and
a light-emitting element in a sealed volume and overlapping with the power receiving electrode, the light-emitting element comprising a layer including a first electrode, a second electrode, and an electroluminescent layer interposed between the first electrode and the second electrode,
wherein the power receiving electrode comprises a plate-like shaped conductive substrate electrically connected to the first electrode,
wherein the sealed volume is defined by a first substrate, a second substrate facing the first substrate, and a sealing material between the first substrate and the second substrate, and
wherein the plate-like shaped conductive substrate is one of the first substrate and the second substrate.

25. The light-emitting device according to claim 24,
wherein the plate-like shaped conductive substrate is electrically connected to the first electrode via one terminal only.

26. A light-emitting device comprising:
a power receiving electrode; and
a light-emitting element overlapping with the power receiving electrode, the light-emitting element comprising a layer including a first electrode, a second electrode, and an electroluminescent layer,
wherein the power receiving electrode comprises a plate-like shaped conductive substrate electrically connected to the first electrode.

27. The light-emitting device according to claim 26,
wherein the plate-like shaped conductive substrate is electrically connected to the first electrode via one terminal only.

28. The light-emitting device according to claim 26, further comprising a rectifier circuit,
wherein the power receiving electrode is configured to induce a voltage by electric field coupling,
wherein the rectifier circuit comprises only one terminal electrically connected to the power receiving electrode, and
wherein the rectifier circuit is configured to rectify alternating-current received by the power receiving electrode and to generate direct-current power for driving the light-emitting element.

* * * * *